(12) United States Patent
Yasuda

(10) Patent No.: US 8,461,563 B2
(45) Date of Patent: Jun. 11, 2013

(54) RESISTANCE CHANGE MEMORY

(75) Inventor: Naoki Yasuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/226,974

(22) Filed: Sep. 7, 2011

(65) Prior Publication Data
US 2012/0061639 A1 Mar. 15, 2012

(30) Foreign Application Priority Data

Sep. 14, 2010 (JP) ................................. 2010-206000

(51) Int. Cl.
*H01L 29/02* (2006.01)
(52) U.S. Cl.
USPC ............................................. 257/2; 257/497
(58) Field of Classification Search
USPC .. 257/2–5, 109, 497–593, E29.326–E29.328, 257/E45.002
See application file for complete search history.

(56) References Cited

U.S. PATENT DOCUMENTS

| 4,729,964 | A | * | 3/1988 | Natsuaki et al. | 438/220 |
| 4,751,201 | A | * | 6/1988 | Nottenburg et al. | 438/93 |
| 5,021,845 | A | * | 6/1991 | Hashimoto | 257/331 |
| 5,583,075 | A | * | 12/1996 | Ohzu et al. | 438/212 |
| 6,104,045 | A | * | 8/2000 | Forbes et al. | 257/141 |
| 6,388,272 | B1 | * | 5/2002 | Odekirk | 257/77 |
| 6,420,215 | B1 | * | 7/2002 | Knall et al. | 438/131 |
| 6,528,356 | B2 | * | 3/2003 | Nemati et al. | 438/135 |
| 6,593,218 | B2 | * | 7/2003 | Porter et al. | 438/527 |
| 6,677,204 | B2 | * | 1/2004 | Cleeves et al. | 438/268 |
| 6,690,035 | B1 | * | 2/2004 | Yokogawa et al. | 257/77 |
| 6,852,602 | B2 | * | 2/2005 | Kanzawa et al. | 438/312 |
| 6,989,553 | B2 | * | 1/2006 | Yokogawa et al. | 257/77 |
| 7,052,941 | B2 | * | 5/2006 | Lee | 438/152 |
| 7,488,627 | B1 | * | 2/2009 | Nemati et al. | 438/136 |
| 8,274,130 | B2 | * | 9/2012 | Mihnea et al. | 257/497 |
| 2001/0055838 | A1 | * | 12/2001 | Walker et al. | 438/129 |

(Continued)

FOREIGN PATENT DOCUMENTS

| JP | 6-163846 | 6/1994 |
| JP | 2008-503085 | 1/2008 |
| WO | WO 2005/124787 A2 | 12/2005 |

OTHER PUBLICATIONS

Jin-Woo Han, et al., "Bistable Resistor (Biristor)—Gateless Silicon Nanowire Memory", 2010 Symposium on VLSI Technology Digest of Technical Papers, Jun. 2010, pp. 171-172.

*Primary Examiner* — Matthew Landau
*Assistant Examiner* — Michael Hung
(74) *Attorney, Agent, or Firm* — Oblon, Spivak, McClelland, Maier & Neustadt, L.L.P.

(57) ABSTRACT

According to one embodiment, a resistance change memory includes a memory cell unit. The memory cell unit is configured to stack a resistance change element and a diode element having non-ohmic properties, and the diode element is configured to stack in order to a semiconductor layer having a first conductivity type, a semiconductor layer having a second conductivity type, and a semiconductor layer having the first conductivity type from the first interconnect layer side. An area density of dopant impurities in the semiconductor layer having the second conductivity type is larger than a sum total of area densities of dopant impurities in the two semiconductor layers having the first conductivity type, and smaller than double an area density of an electric flux number associated with a threshold electric field of an interband tunneling current of a material includes the semiconductor layer having the second conductivity type.

20 Claims, 19 Drawing Sheets

U.S. PATENT DOCUMENTS

| | | | |
|---|---|---|---|
| 2003/0173622 A1* | 9/2003 | Porter et al. | 257/355 |
| 2008/0318397 A1* | 12/2008 | Herner | 438/483 |
| 2009/0173985 A1* | 7/2009 | Lee et al. | 257/315 |
| 2010/0163831 A1* | 7/2010 | Herner | 257/3 |

* cited by examiner

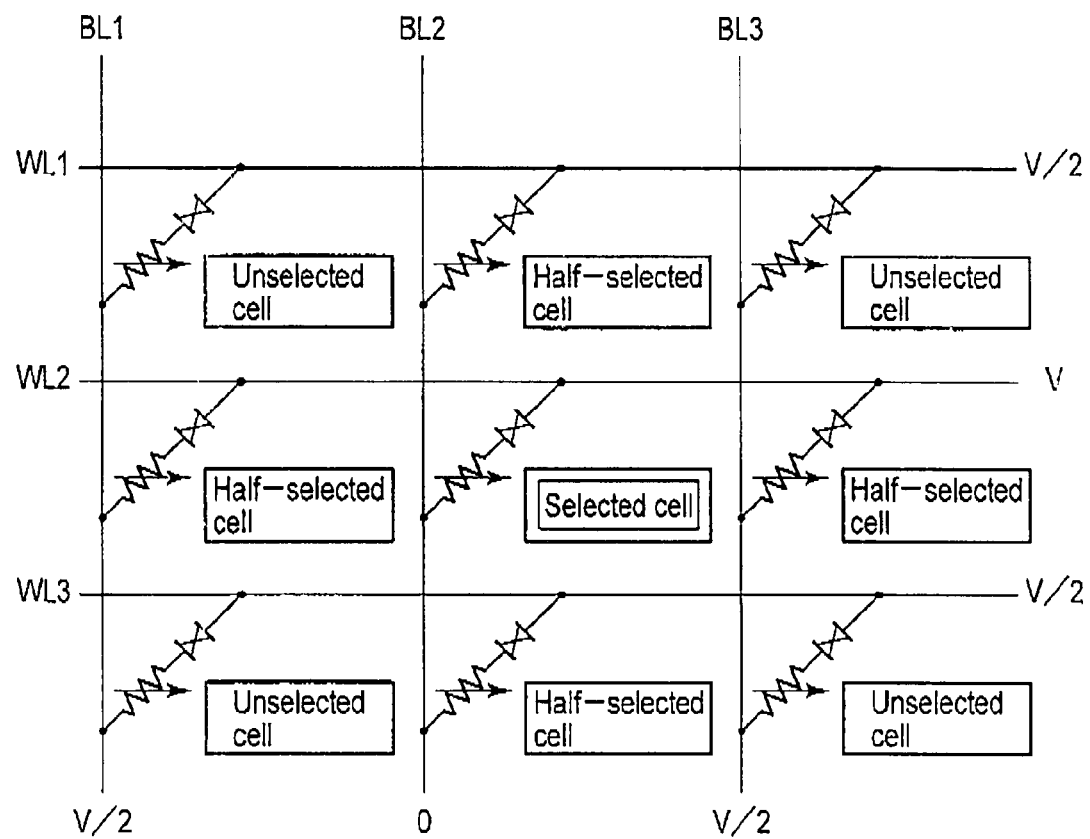
F I G. 1

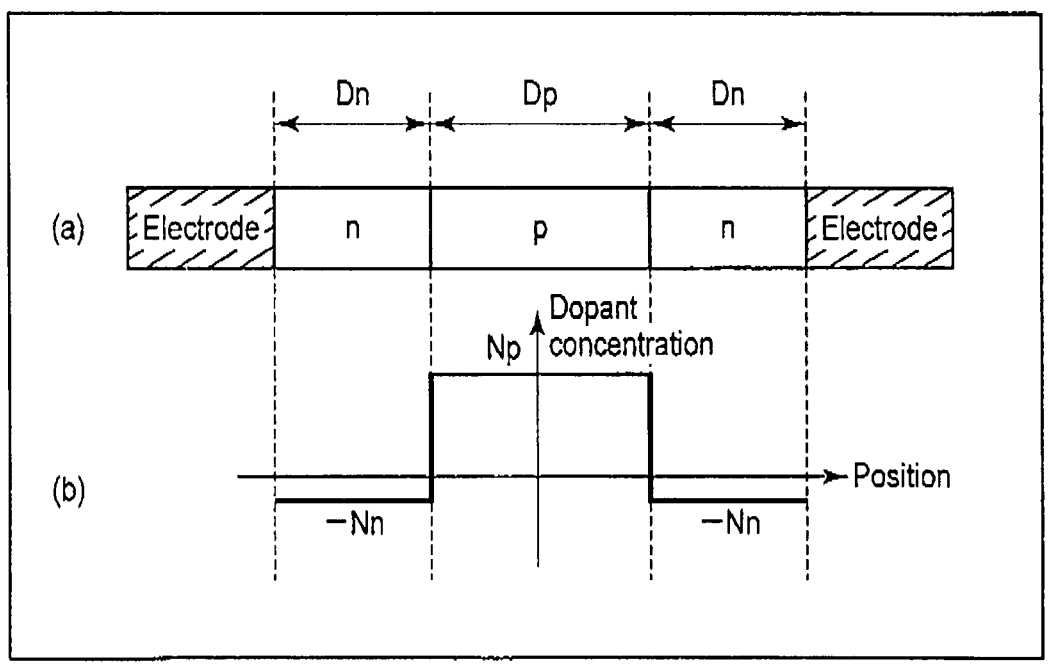
F I G. 4

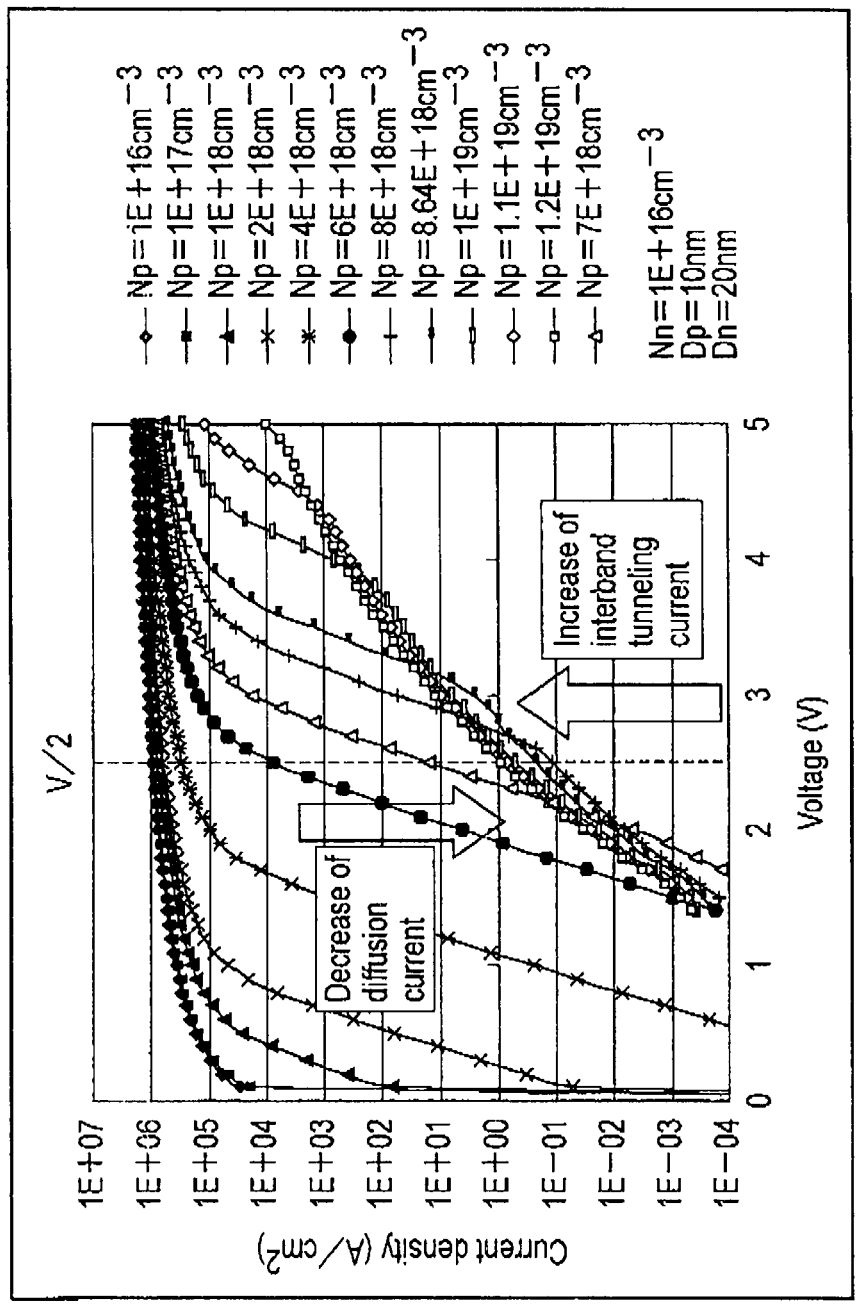
F I G. 5

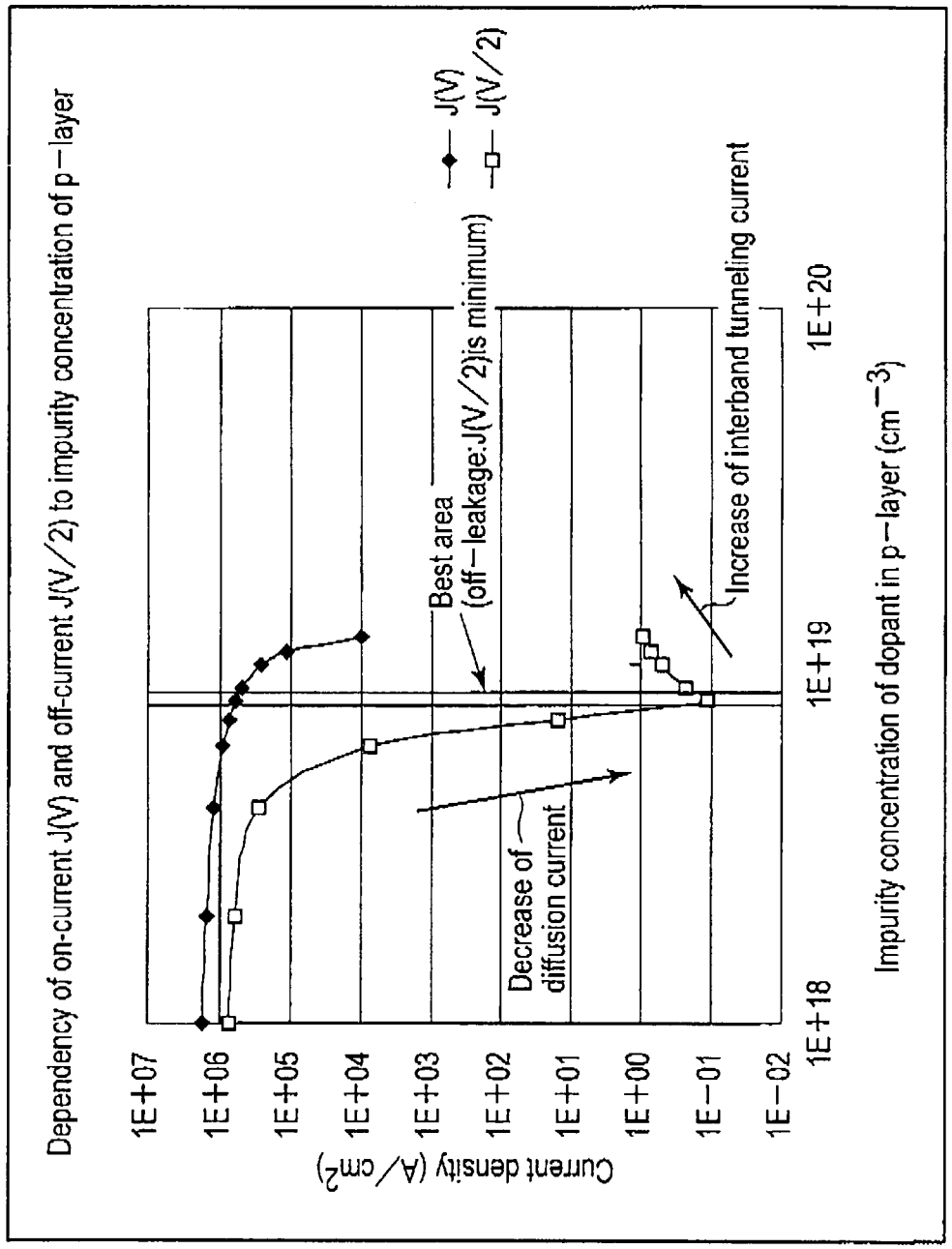
F I G. 6

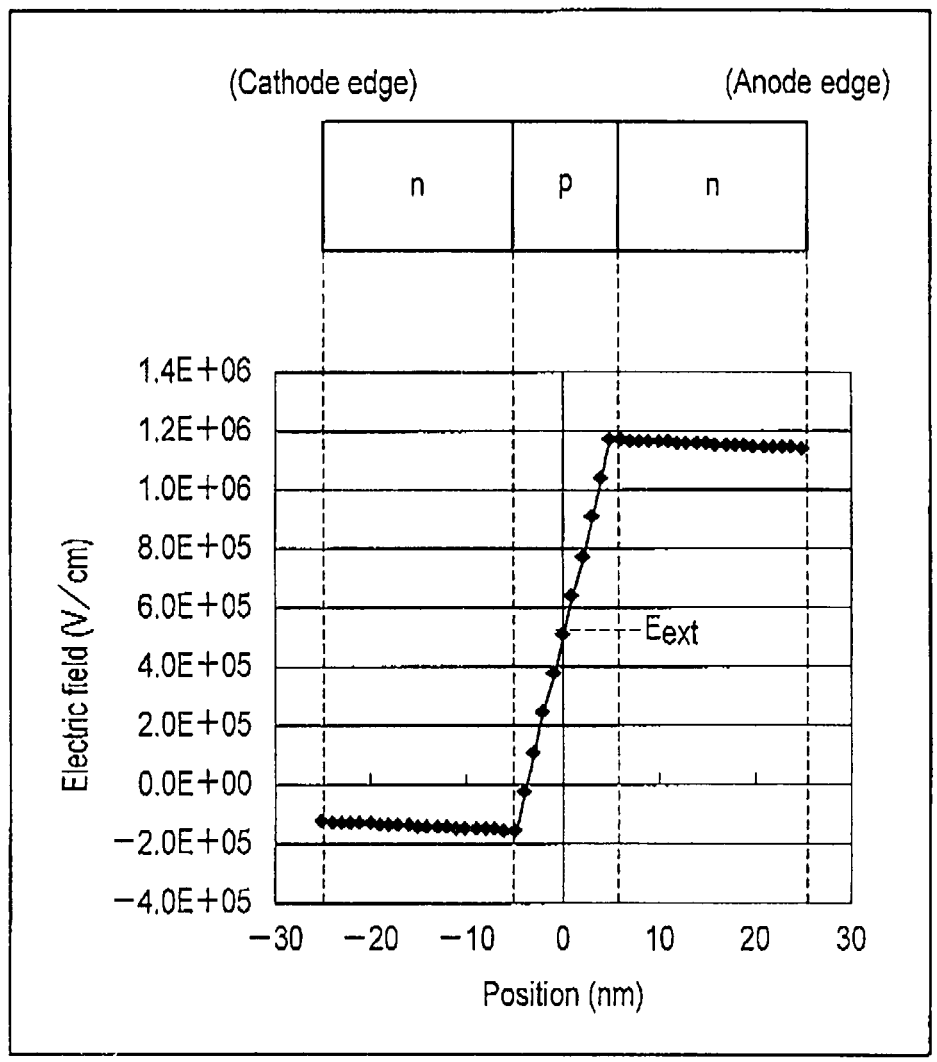
F I G. 8 A

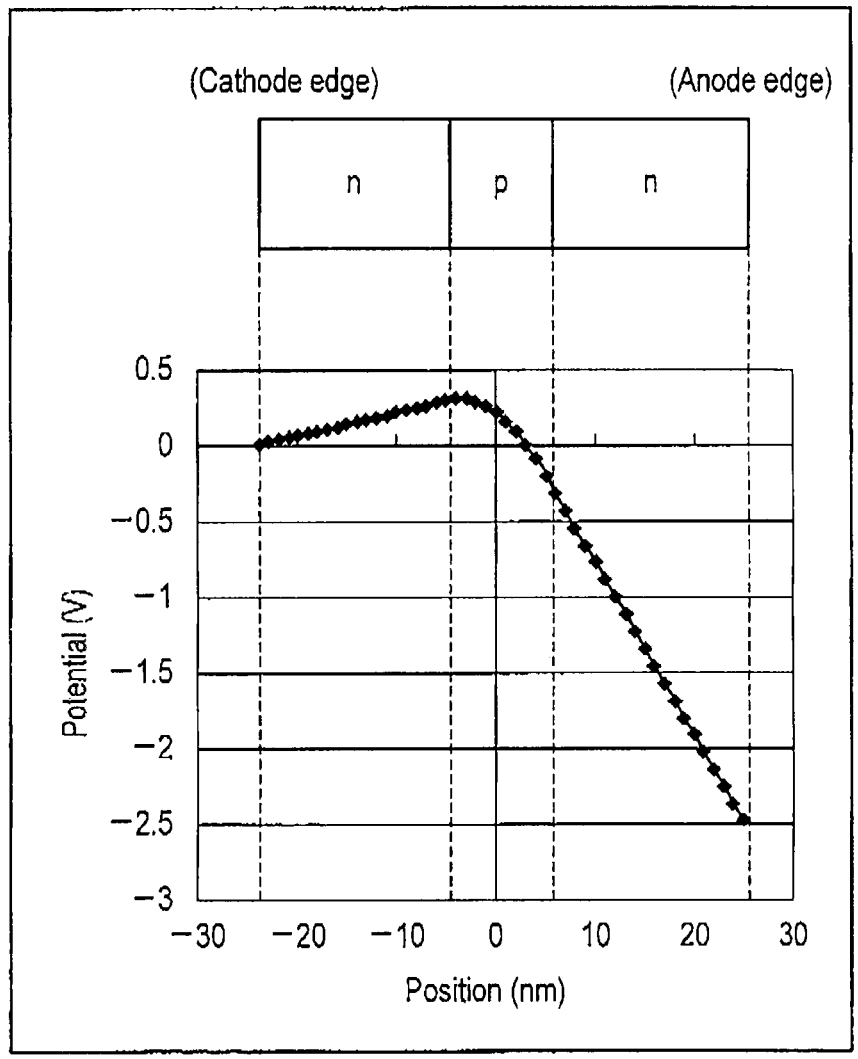
F I G. 8 B

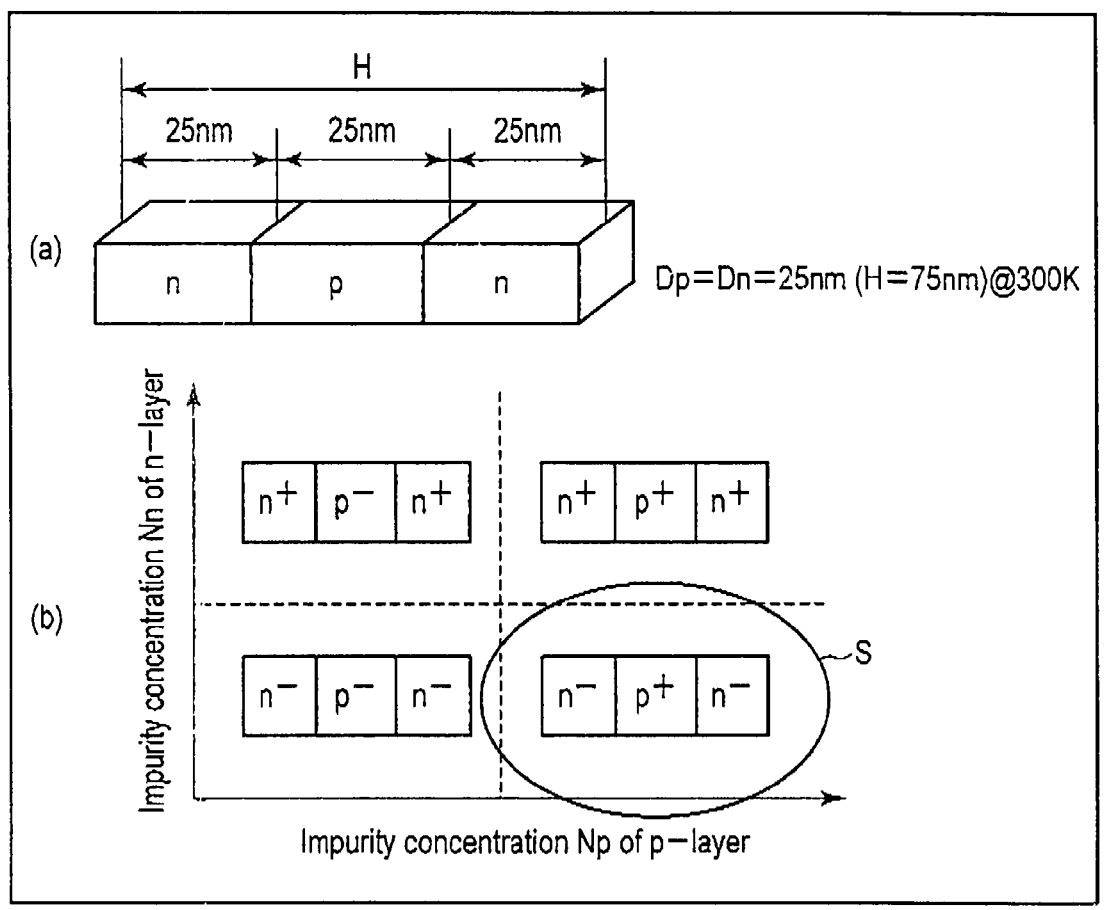
F I G. 1 2

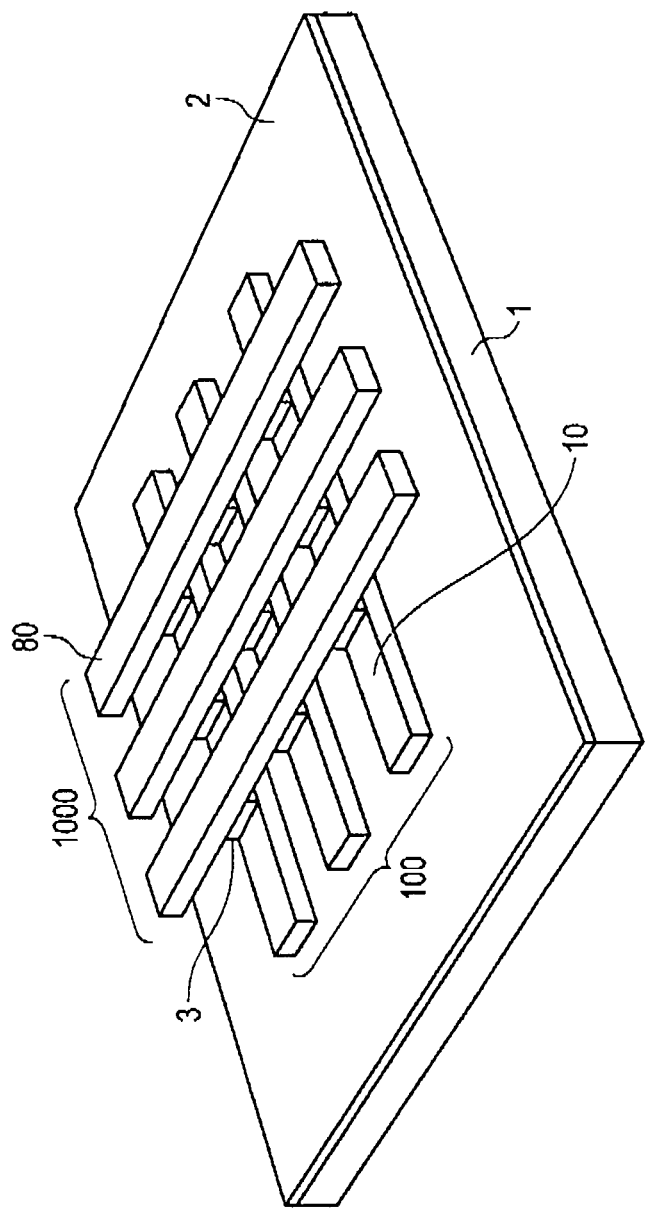
F I G. 16

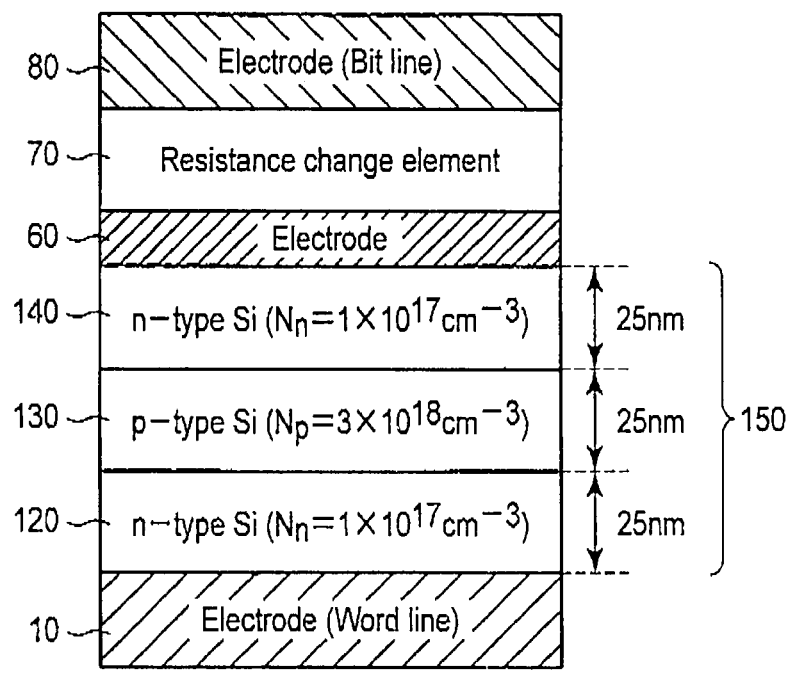
F I G. 17
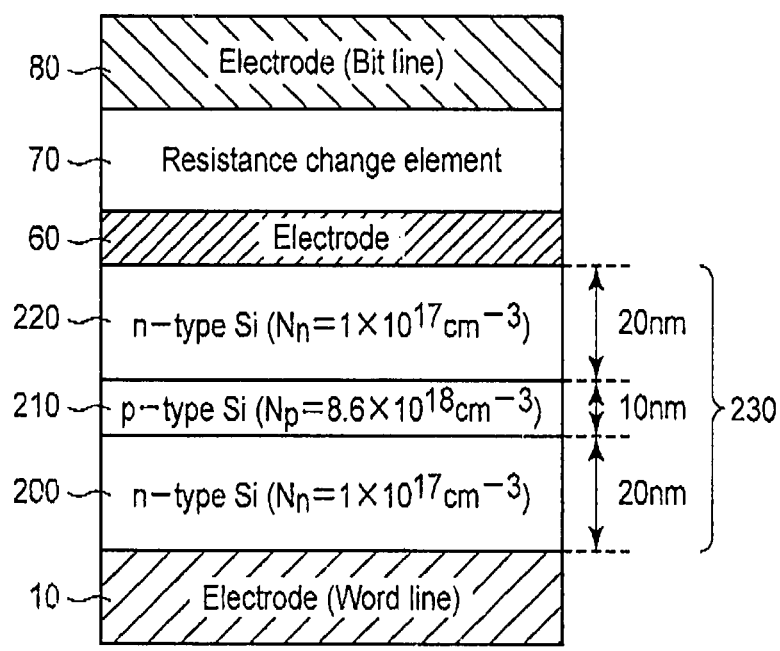
F I G. 18

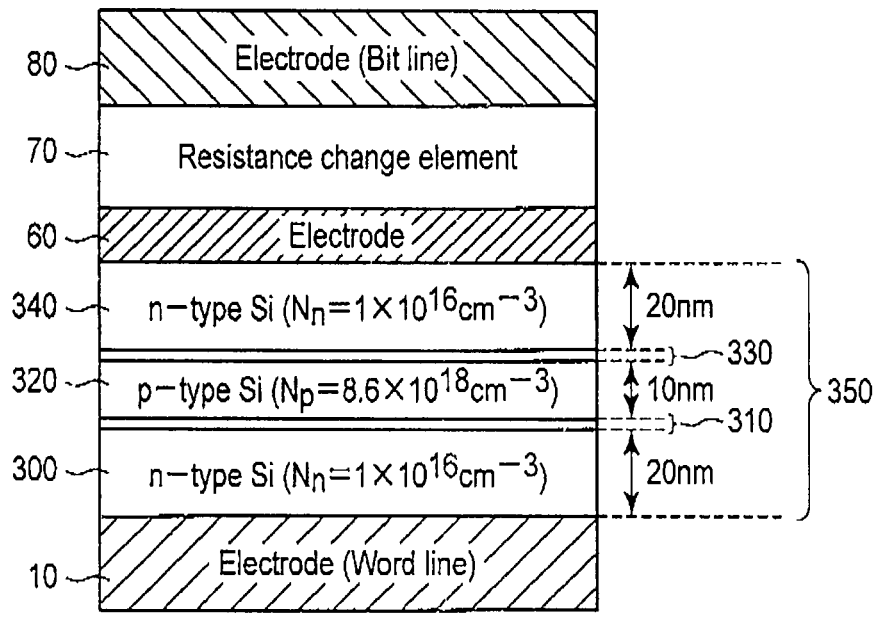
F I G. 19
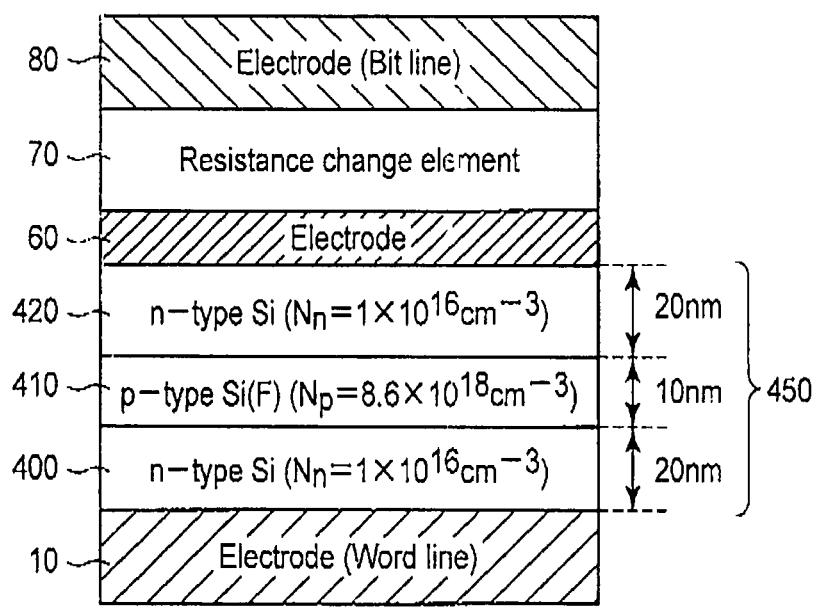
F I G. 20

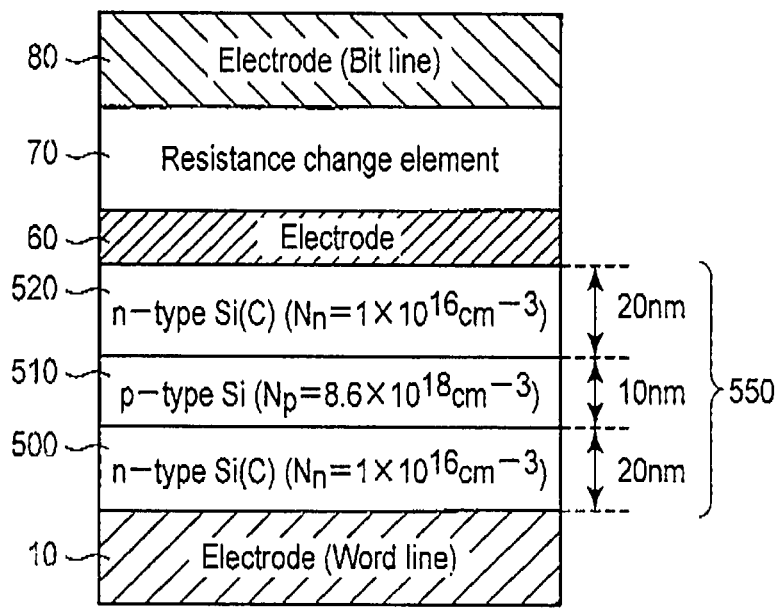
F I G. 2 1
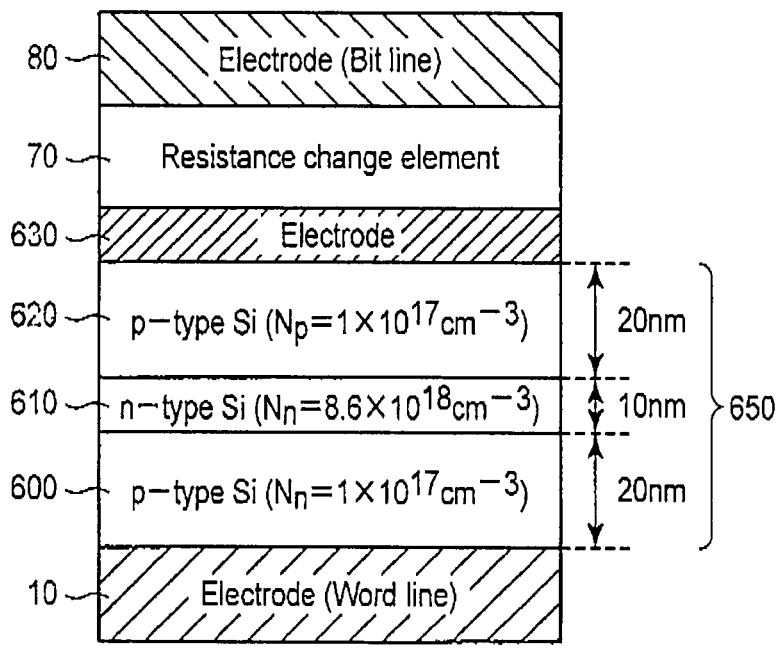
F I G. 2 2

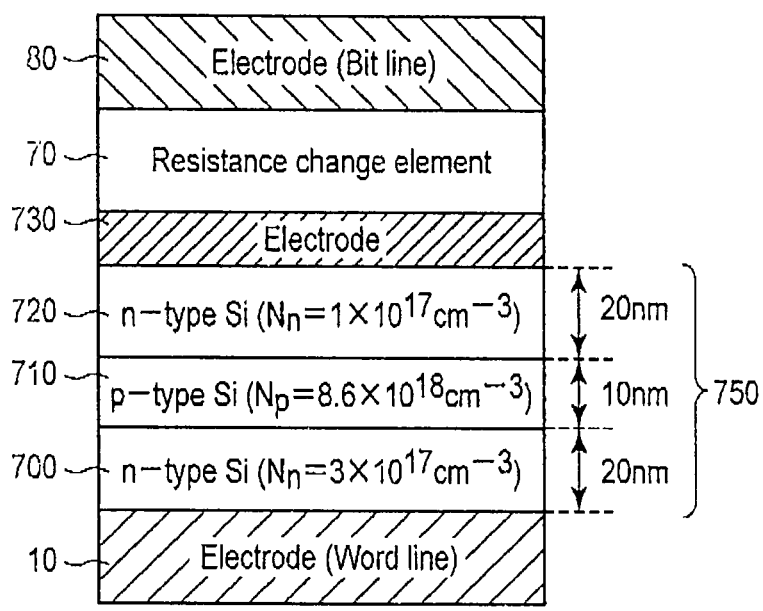
F I G. 23

RESISTANCE CHANGE MEMORY

CROSS-REFERENCE TO RELATED APPLICATIONS

This application is based upon and claims the benefit of priority from prior Japanese Patent Application No. 2010-206000, filed Sep. 14, 2010, the entire contents of which are incorporated herein by reference.

FIELD

Embodiments described herein relate generally to a resistance change memory.

BACKGROUND

NAND flash memories are reaching the limit of miniaturization, and hence there has been demanded a novel memory technology in which intercell interference is small and which is suitable for miniaturization and realization of a high capacity. As a candidate for this technology, studies and development of a resistance change memory have been positively advanced.

In a memory cell array of the resistance change memory, a crosspoint structure in which a resistance change element is connected to a diode element (an element that exhibits non-ohmic current-voltage characteristics) in series at an intersecting portion of two conductive lines is often adopted. That is because the high capacity of the crosspoint structure can be readily achieved by providing a three-dimensional memory cell array.

Here, as one technical candidate for the diode element, a punch-through diode having a semiconductor stacked structure of n/p/n or p/n/p has been considered. However, the conventional punch-through diode has an operation system that each layer has a large thickness, neutral regions remain in some of elements under zero bias or a low voltage, and all layers are completely depleted under a high voltage. Therefore, when this structure is applied as a diode element in the resistance change memory as it is, since a thickness of the diode element is too large, this structure is not suitable for the resistance change memory that has a three-dimensional structure as a premise.

On the other hand, when a thickness of each layer in the punch-through diode is reduced, all the layers are completely depleted even under zero bias or a low voltage, and a problem occurs in a memory cell selecting function required in the diode element in the resistance change memory. That is, in this case, an OFF current (a leak current flowing through half-selected memory cells) is increased.

BRIEF DESCRIPTION OF THE DRAWINGS

FIG. 1 is a circuit diagram showing a memory cell array having a crosspoint structure;

FIG. 4 is a schematic view for defining an impurity concentration of dopants and a thickness of each layer;

FIG. 5 is a view showing current-voltage characteristics when an impurity concentration in a p-layer at the center is changed;

FIG. 6 is a view showing a selected current J(V) and a half-selected current J(V/2) as a function of an impurity concentration $N_p$ of the p-layer at the center;

FIG. 8A is a view showing an electric field distribution when an external electric field is applied;

FIG. 8B is a view showing a potential distribution when an external electric field is applied;

FIG. 12 is a view for explaining dependency of impurity concentrations of the p-layer and the n-layer;

FIG. 16 is a perspective view showing a configuration of a memory cell array of a first embodiment;

FIG. 17 is a cross-sectional view showing a configuration of a memory cell unit of the first embodiment;

FIG. 18 is a cross-sectional view showing a configuration of a memory cell unit of a second embodiment;

FIG. 19 is a cross-sectional view showing a configuration of a memory cell unit of a third embodiment;

FIG. 20 is a cross-sectional view showing a configuration of a memory cell unit of a fourth embodiment;

FIG. 21 is a cross-sectional view showing a configuration of a memory cell unit of a fifth embodiment;

FIG. 22 is a cross-sectional view showing a configuration of a memory cell unit of a sixth embodiment; and FIG. 23 is a cross-sectional view showing a configuration of a memory cell unit of a seventh embodiment.

DETAILED DESCRIPTION

Figure 2:
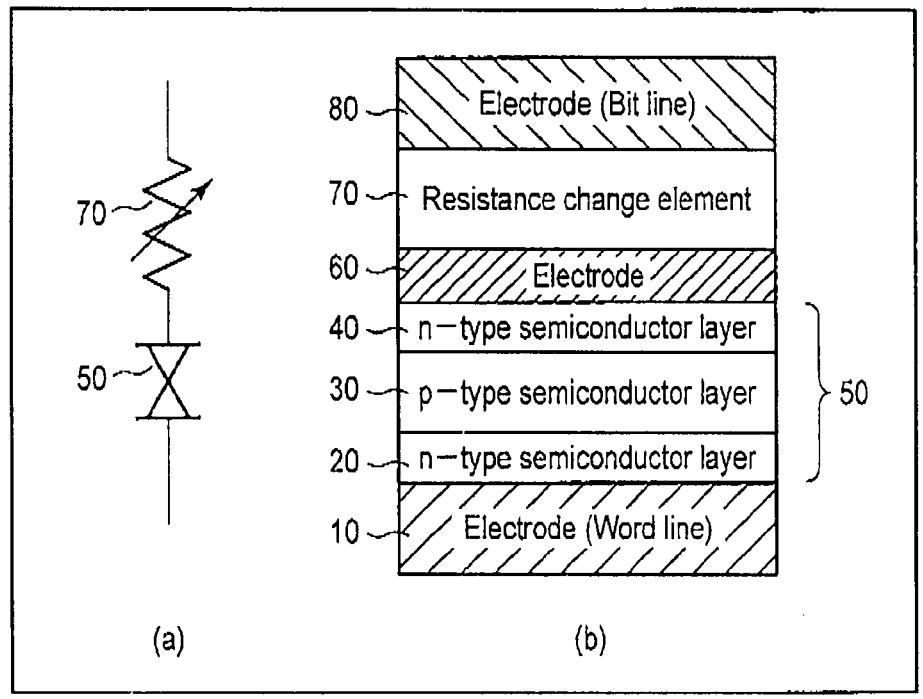
FIG. 2 is an explanatory view concerning a punch-through diode.

In general, according to one embodiment, a resistance change memory comprising: a first interconnect layer which has first interconnect lines arranged in parallel to each other on a semiconductor substrate; a second interconnect layer which is provided to be apart from the first interconnect layer and has second interconnect lines arranged in parallel to each other to cross the first interconnect lines; and memory cell units arranged at respective intersecting portions of the first interconnect lines and the second interconnect lines, wherein each of the memory cell units is configured to stack a resistance change element which stores states having different resistance values as data and a diode element having non-ohmic properties, and the diode element is configured to stack in order to a semiconductor layer having a first conductivity type, a semiconductor layer having a second conductivity type, and a semiconductor layer having the first conductivity type from the first interconnect layer side, and an area density of dopant impurities in the semiconductor layer having the second conductivity type is larger than a sum total of area densities of dopant impurities in the two semiconductor layers having the first conductivity type, and smaller than double an area density of an electric flux number associated with a threshold electric field of an interband tunneling current of a material comprising the semiconductor layer having the second conductivity type. An area density of dopant impurities in the semiconductor layer having the second conductivity type is larger than a sum total of area densities of dopant impurities in the two semiconductor layers having the first conductivity type, and set within the range of ±20% of a sum of an area density of an electric flux number associated with a threshold electric field of an interband tunneling current of a material constituting the semiconductor layer having the second conductivity type and ¼ of the total area densities of the dopant impurities in the two semiconductor layers having the first conductivity type.

Here, a threshold electric field of the interband tunneling current is defined as an electric field when a current density reaches $1\times10^{-10}$ (A/cm$^2$) in a theoretical formula of a Fowler-Nordheim (FN) tunneling current on the assumption that a band gap of a material constituting a semiconductor layer which is of the second conductivity type is a potential barrier. Further, the area density of the electric flux number is defined as an amount obtained by dividing an electric flux density $\in$E, which is defined as a product of a dielectric constant $\in$ of the material constituting the semiconductor layer which is of the second conductivity type and an electric field E, by an electric charge quantum q ($=\in$E/q).

(Resistance Change Memory)

FIG. 1 shows an example of a memory cell array of a resistance change memory.

The memory cell array of the resistance change memory has a crosspoint structure.

The resistance change memory means a semiconductor memory that utilizes a resistance change element as a recording medium. Here, the resistance change element means an element whose resistance value changes due to, e.g., a voltage, a current, heat, or chemical energy, and the concept of resistance change element includes a phase-change element. A ReRAM (Resistive Random Access Memory) is a resistance change memory, and a metal oxide is used as a resistance change element.

In the memory cell array having the crosspoint structure, the resistance change element and a diode element (a non-ohmic element having a cell selecting function) are connected in series at an intersecting point of a word line and a bit line.

In the case of applying voltages to the memory cell array having the crosspoint structure to read resistance values, a potential V is applied to a word line (WL2) of a selected cell and a zero potential is applied to a bit line (BL2) of the selected cell. Furthermore, a potential V/2 is applied to any other word lines and bit lines.

When such potentials are applied, the selected memory cell has a voltage V at both ends, and each of the other cells has a voltage V/2 or zero at both ends. The memory cell having the voltage V/2 applied thereto will be referred to as a cell in a "half-selected state", and the memory cell having the zero voltage applied thereto will be referred to as a cell in an "unselected state".

As is obvious from FIG. 1, suppressing a current flowing through each memory cell in the half-selected state to increase its ratio to a current flowing through the memory cell in the selected state is fundamental for the memory cell array having the crosspoint structure. Therefore, a ratio of an ON current (a current flowing in the selected state) and an OFF current (a current flowing in the half-selected state) of the diode element connected to the resistance change element in series must be high.

Meanwhile, in recent studies and development of the resistance change memory, in light of improving the reliability of the resistance change element, there are many examples of performing a bipolar operation rather than a unipolar operation of the resistance element. Here, the unipolar operation means an operation system of applying voltages having the same polarity when setting/resetting the resistance change memory. In contrast, the bipolar operation means an operation system of applying voltages having different polarities when setting/resetting the resistance change element.

In the unipolar operation, reliability problems are apt to occur since the resetting operation is carried out through a thermal process. On the other hand, in the bipolar operation, reliability problems hardly occur since a resistance change is realized by movement of ions in the element, but this operation is more complex in that power supplies having both the polarities must be prepared. Additionally, the diode element connected to the resistance change element in series must exhibit non-ohmic and symmetric current-voltage characteristics with respect to application of voltages having both the polarities so that the diode element can have a memory cell selecting function in the application of the voltages having both the polarities.

As a technological candidate of the diode element that enables the bipolar operation, a punch-through diode having a semiconductor stacked structure of n/p/n or p/n/p can be mentioned. However, each layer has a large thickness in the conventional punch-through diode, and in an operation system thereof, a neutral region remains in a part of the element under zero bias or a low voltage and all the layers are completely depleted under a high voltage.

Thus, in this embodiment, a thickness of each layer in the punch-through diode is reduced, and a configuration in which all the layers are completely depleted even under zero bias or a low voltage (the depleted layers alone are present and the neutral region is not present) is premised. As a result, a diode element that has a small film thickness and is suitable for realization of a three-dimensional resistance change memory can be achieved.

However, in the punch-through diode, if all the layers are completely depleted even under zero bias or a low voltage, the memory cell selecting function required for the diode element in the resistance change memory is obstructed. That is, in this case, an OFF current (a leak current flowing through a half-selected memory cell) increases.

On the other hand, the OFF current is reduced by appropriately selecting an impurity concentration of dopants in a p-layer at the center in an npn-type diode element or appropriately selecting an impurity concentration of dopants in an n-layer at the center in a pnp-type diode element. The specific impurity concentration of the dopants and the reasons thereof will be described later.

(Principles)

The diode element (the punch-through diode) in the memory cell will be first described with reference to FIG. 2.

(a) in FIG. 2 shows an equivalent circuit of the memory cell and represents that resistance change element 70 is connected to diode element 50 having non-ohmic electric conduction properties in series. (b) in FIG. 2 is a cross-sectional view of the memory cell. Diode element 50 is formed by sequentially stacking n-type semiconductor layer 20, p-type semiconductor layer 30, and n-type semiconductor layer 40 on lower electrode 10 functioning as a word line (a first interconnect layer). Further, intermediate electrode 60 is arranged on diode element 50, resistance change element (a variable resistance film) 70 is arranged thereon, and upper electrode 80 functioning as a bit line (a second interconnect line) is further arranged thereon.

Figure 3:
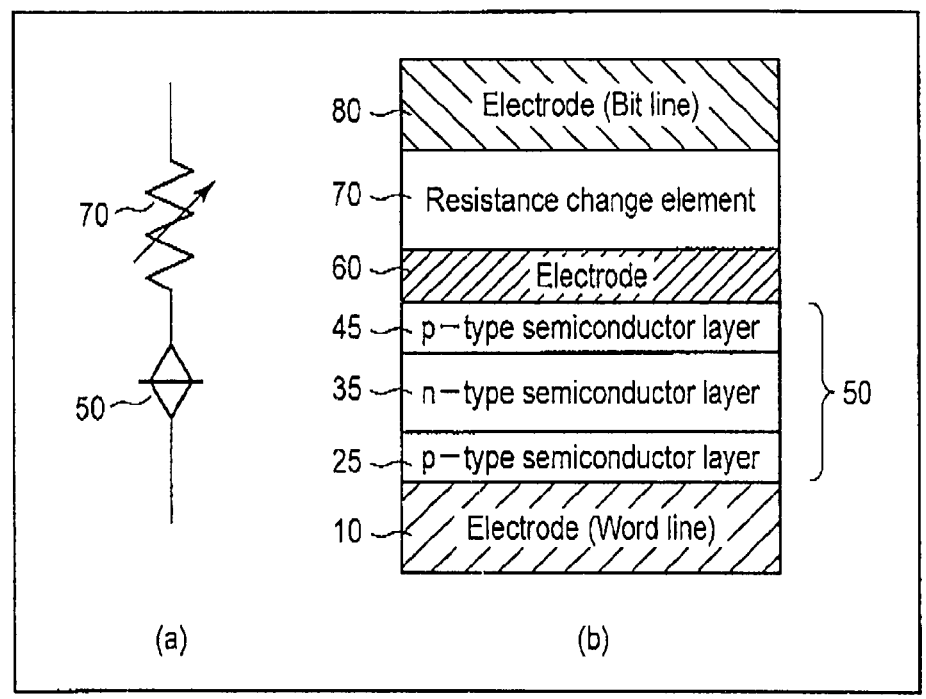
FIG. 3 is an explanatory view concerning a pnp-type diode element.

It is to be noted that a stacked film (an npn structure) constituted of n-type semiconductor layer 20, p-type semiconductor layer 30, and n-type semiconductor layer 40 may be substituted by a stacked film (a pnp structure) constituted of p-type semiconductor layer 25, n-type semiconductor layer 35, and p-type semiconductor layer 45 as shown in FIG. 3.

Further, intermediate electrode 60 may be omitted in the configuration. Furthermore, to suppress diffusion of dopants (impurities) between the n-type semiconductor layer and the p-type semiconductor layer, a thin film configured for suppressing the diffusion may be interposed between these layers. Moreover, a thin film configured for avoiding a reaction may be interposed between the semiconductor layer and the electrode.

Additionally, to suppress an OFF current (a current in the half-selected state) by using such a diode configuration, a potential barrier must be present at a cathode edge (a carrier injection edge) in the half-selected state, and a maximum electric field in the diode must not be greater than a threshold electric field of an inter-semiconductor-band tunneling current in the half-selected state. These conditions can be realized by setting impurity concentrations of the dopants in the respective semiconductor layers in the diode as follows.

It is to be noted that the npn structure will be assumed in the following example, but the same explanation holds if the n type and the p type of the impurities as the dopants in the pnp structure are reversed.

FIG. 4 is a schematic view for defining an impurity concentration of dopants and a thickness (a thickness in a direction extending between the lower electrode and the upper electrode) of each semiconductor layer in the diode having the npn structure.

Impurity concentrations (unit: $cm^{-3}$) of dopants in an n-layer (e.g., an n-type silicon layer) and a p-layer (e.g., a p-type silicon layer) are defined as $N_n$ and $N_p$, respectively. Further, thicknesses (unit: cm) of the n-layer and the p-layer are defined as $D_n$ and $D_p$, respectively. It is to be noted that $N_n$ and $N_p$ correspond to an ionized donor density and an ionized acceptor density formed by impurities as the dopants, respectively.

FIG. 5 shows current-voltage characteristics (simulation results) when the impurity concentration $N_p$ in the p-layer is varied in the diode having the npn structure.

In this simulation, other amounts defined in FIG. 4 are $N_n=1\times10^{16}$ $cm^{-3}$, $D_p=10$ nm, and $D_n=20$ nm.

As is obvious from the current-voltage (J-V) characteristics shown in FIG. 5, when the p-type impurity concentration is gradually increased, a position at which a current (a diffusion current) in the diode is generated is shifted toward a high-voltage side. This shift is associated with a state that a potential barrier of the p-layer at the center in the npn structure is raised and the diffusion current is reduced when the impurity concentration in the p-layer is increased.

However, when the impurity concentration in the p-layer is increased beyond a given level, a current component (an interband tunneling current) whose increase rate with respect to a voltage is smaller than that of the diffusion current starts to be generated.

It can be understood from the above-described simulation results that the impurity concentration in the p-layer that optimizes both the decrease in the diffusion current and the increase in the interband tunneling current and minimizes the OFF current in the half-selected state is present.

FIG. 6 shows a result obtained by determining a voltage applied to the diode in the half-selected state as V/2=2.5 (V) and extracting a half-selected current J(V/2) as a function of the p-type impurity concentration $N_P$.

As can be understood from FIG. 6, the half-selected current J(V/2) is decreased with an increase in the impurity concentration of the dopants until $N_p=8.6\times10^{18}$ $cm^{-3}$ is reached, but, in contrast, the half-selected current J(V/2) is increased when the impurity concentration of the dopants is raised. That is, an optimum value of the impurity concentration of the dopants in the p-layer is determined based on the balance of a decrease in diffusion current due to an increase in potential barrier at a cathode edge (an electron injection edge) and generation of an interband tunneling current (a BTBT current) due to a local increase in electric field on an anode side (an electron emission side).

FIG. 6 also shows a behavior of an ON current in the case of V=5 (V).

Although the ON current is monotonously decreased as the impurity concentration in the p-layer at the center is increased, the ON current in the best area of the OFF current exceeds $10^5$ $A/cm^2$. Regular setting/resetting operations of the resistance change element can be carried out with a current density of approximately $10^5$ $A/cm^2$ (a current density of at least $10^4$ $A/cm^2$ or above) without problem, and hence the optimum impurity density in the p-layer can be decided by focusing attention to minimization of the OFF current (a current flowing in the half-selected state).

Figure 7:
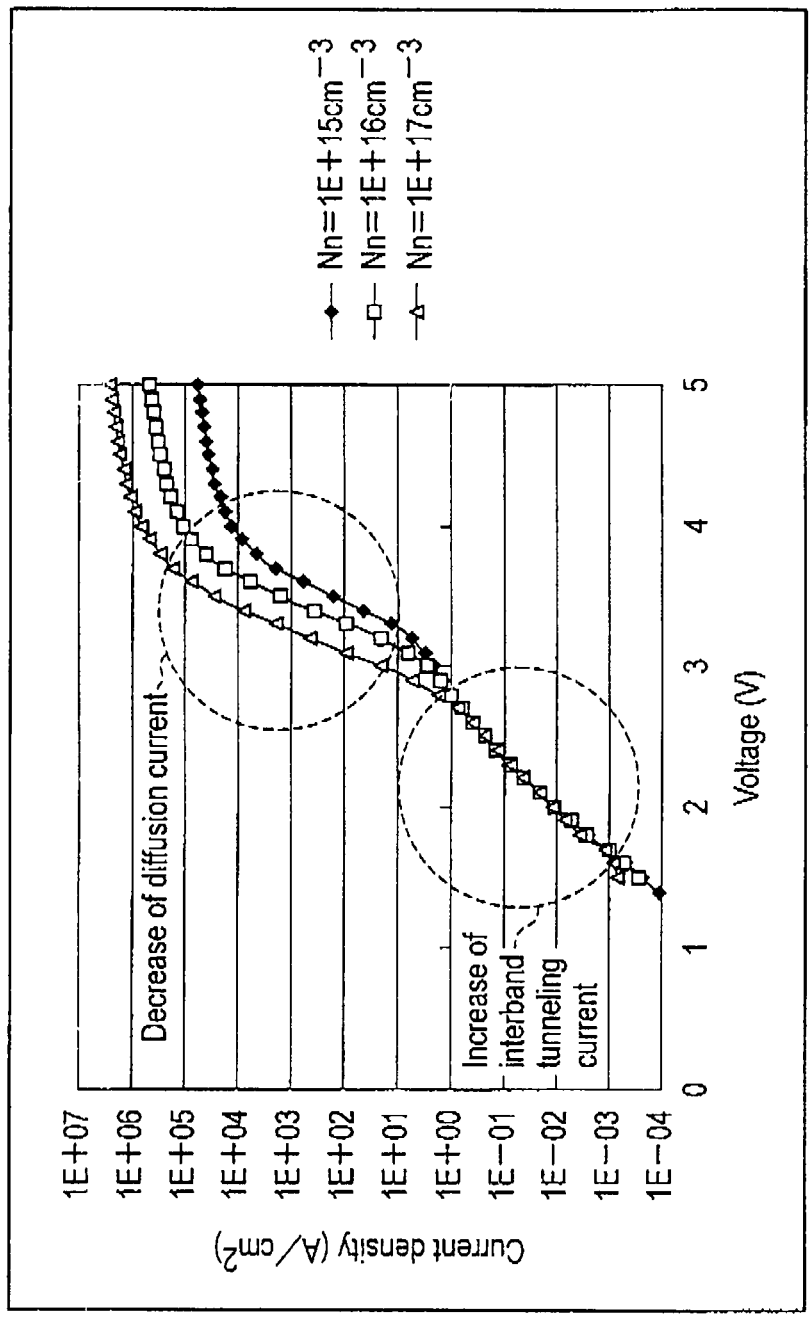
FIG. 7 is a view showing current-voltage characteristics when impurity concentrations in p-layers at both ends are changed.

FIG. 7 shows current-voltage characteristics when the impurity concentration of the dopants in the n-layer is varied. An increase in the impurity concentration in the n-layer makes the potential barrier at the cathode edge low. Therefore, the diffusion current is increased. On the other hand, since an electric field on the anode side does not change, the interband tunneling current is fixed. Further, when this increase in diffusion current component reaches a voltage area in the half-selected state (a voltage: V/2), an increase in OFF current occurs.

Therefore, the increase in impurity concentration of the dopants in the n-layer has an advantage, i.e., the increase in ON current, but also a disadvantage in that the increase in diffusion current needs to be suppressed so that the OFF current (a current flowing in the half-selected state) cannot be affected.

Based on the above considerations, a policy concerning the optimum design for the impurity concentrations of the dopants in the p-layer and the n-layer can be determined. A calculation based on a simple one-dimensional model will be used in the following description in order to quantitatively derive the impurity concentration of the dopants in each layer.

(Best Area of Impurity Concentration of Dopants in P-Layer at Center)

FIG. 8A shows an example of an electric field distribution when an external electric field $E_{ext}$ is applied to the diode having the npn structure. Furthermore, FIG. 8B shows an example of a potential distribution when the external electric field $E_{ext}$ is applied to the diode having the npn structure.

In these drawings, a central point of the p-layer is provided as an origin of a positional coordinate.

When symbols representing the impurity concentrations and the thicknesses of the n-layer and the p-layer defined in FIG. 4 are utilized, an electric field in the p-layer can be expressed by the following Expression (1):

$$E(x) = E_{ext} + \frac{qN_px}{\varepsilon_{Si}} \left( -\frac{D_p}{2} \le x \le \frac{D_p}{2} \right) \quad (1)$$

where $\varepsilon_{si}$ is a dielectric constant of silicon and q is an electric charge quantum. Moreover, when a minimum electric field $E_{min}=E(-D_p/2)$ on a boundary surface between the player at the center and the n-layer on the cathode side is used, an electric field in the n-layer on the cathode side (an electron injection side) can be represented by the following Expression (2).

$$E(x) = -\frac{qN_n\left(x + \frac{D_p}{2}\right)}{\varepsilon_{Si}} + E_{min}\left(x < -\frac{D_p}{2}\right) \quad (2)$$

Likewise, when a maximum electric field $E_{max}=E(D_p/2)$ on a boundary surface between the p-layer at the center and the n-layer on the anode side is used, an electric field in the n-layer on the anode side (an electron release side) can be represented by the following Expression (3).

$$E(x) = -\frac{qN_n\left(x - \frac{D_p}{2}\right)}{\varepsilon_{Si}} + E_{max}\left(x > \frac{D_p}{2}\right) \quad (3)$$

Based on these expressions, the optimum impurity concentration $N_p$ in the p-layer is formulated.

Figure 9:
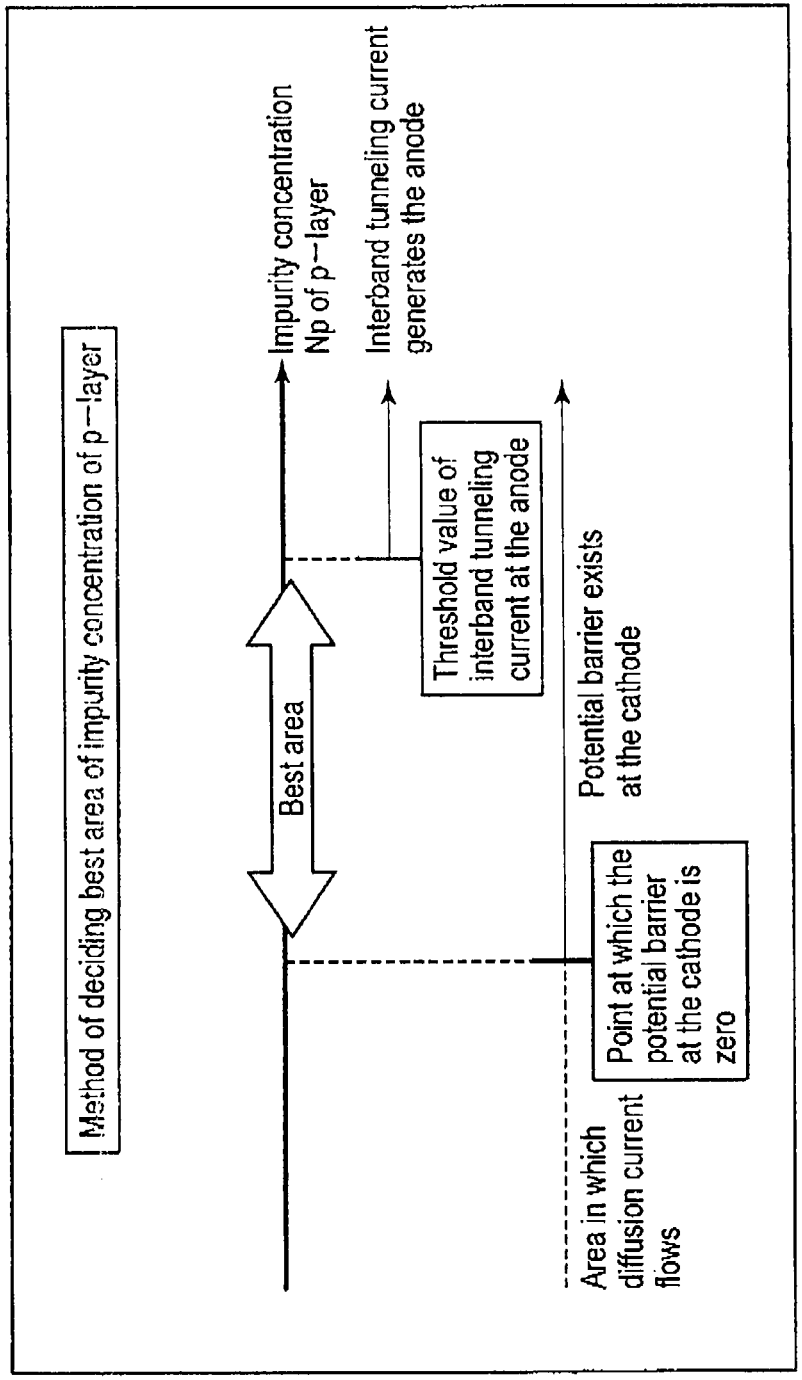
FIG. 9 is a view showing a method of deciding the best area of an impurity concentration in the p-layer at the center.

As shown in FIG. 9, under the circumstances that the external electric field $E_{ext}$ corresponding to the half-selected state is present, the best area of $N_p$ is decided as an area that simultaneously meets two conditions, i.e., the potential barrier is present at the cathode edge and the electric field on the anode side is equal to or below a threshold value of occurrence of the interband tunneling current.

The first condition that the potential barrier is present at the cathode edge will be first considered.

Figure 10:
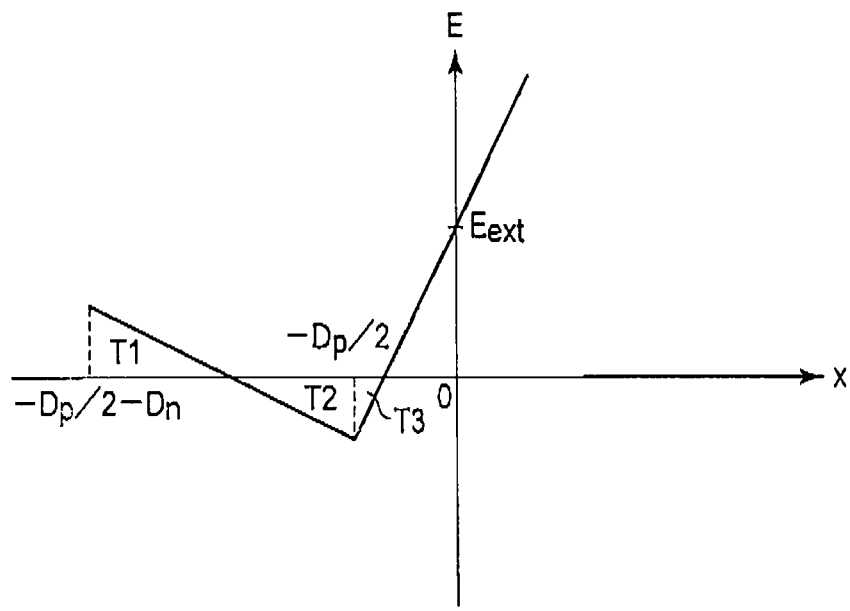
FIG. 10 is a view showing a relationship between an electric field and a distance used for determining a state that a potential barrier height of a cathode end is zero.

A boundary value (a lower limit) of the best area of $N_P$ based on this condition is decided from a state that a potential barrier height on the cathode side is zero. This state corresponds to a condition that an algebraic sum of areas of triangles T1, T2, and T3 becomes zero in FIG. 10 showing a relationship between an electric field and a distance.

In this embodiment, the impurity concentration of the dopants in the p-layer is higher than the impurity concentration of the dopants in the n-layer. Therefore, in FIG. 10, an inclination of a straight line is large when x>−Dp/2. Accordingly, the area of triangle T3 can be considered to be smaller than areas of triangles T1 and T2.

Thus, the condition that the potential barrier height on the cathode side becomes zero can be approximated by a condition that an algebraic sum of areas of triangles T1 and T2 becomes zero. Since this condition is equivalent to a situation that an electric field at a distance coordinate $(-D_p/2-D_n/2)$ becomes zero, the follow Expression (4) can be provided based on Expression (2).

$$E_{min} + \frac{qN_ND_n}{2\varepsilon_{Si}} = 0 \quad (4)$$

That is, when the boundary value (the lower limit) of the best area of $N_p$ is formulated, the following Expression (5) is attained.

$$\frac{2\varepsilon_{Si}E_{ext}}{q} + N_nD_n \le N_pD_p \quad (5)$$

In the following, the second condition that the electric field on the anode side is equal to or below a threshold value of generation of the interband tunneling current is specifically obtained.

Paying attention to the fact that a maximum electric field can be obtained (at the boundary between the n-layer and the p-layer) when $x=D_p/2$ is achieved in Expression (1), a situation that this maximum electric field coincides with or is smaller than a threshold electric field Eth of the interband tunneling current, i.e., that the following Expression (6) can be attained gives an upper limit of the best area of $N_p$.

$$E_{ext} + \frac{qN_pD_p}{2\varepsilon_{Si}} = E_{th} \quad (6)$$

Organizing results of Expression (5) and Expression (6), the best area of an impurity area density $N_pD_p$ of the p-layer is given by the following Expression (7).

$$\frac{2\varepsilon_{Si}E_{ext}}{q} + N_nD_n \le N_pD_p \le \frac{2\varepsilon_{Si}}{q}(E_{th} - E_{ext}) \quad (7)$$

Here, a point to note is that the best area of $N_PD_P$ in Expression (7) is a function of the external electric field $E_{ext}$ applied to the diode element in the half-selected state. In practice, since the diode element is connected to the resistance change element in series, a value of the external electric field $E_{ext}$ varies due to the balance of a resistance value of the resistance change element and impedance of the diode element.

The two situations, i.e., a situation in which the resistance value of the resistance change element is higher than the impedance of the diode element and a situation in which the resistance value of the resistance change element is lower than the impedance of the diode element will be separately considered below.

First, when the resistance value of the resistance change element is sufficiently higher than the impedance of the diode element, since a large part of a voltage applied to each memory cell in the half-selected state is applied to the resistance change element, a voltage applied to the diode element is small, and an electric field applied to the diode element is weak. Therefore, when $E_{ext}=0$ is set in Expression (7), the following Expression (8) must be attained.

$$N_nD_n \le N_pD_p \le \frac{2\varepsilon_{Si}}{q}E_{th} \quad (8)$$

Figure 11:
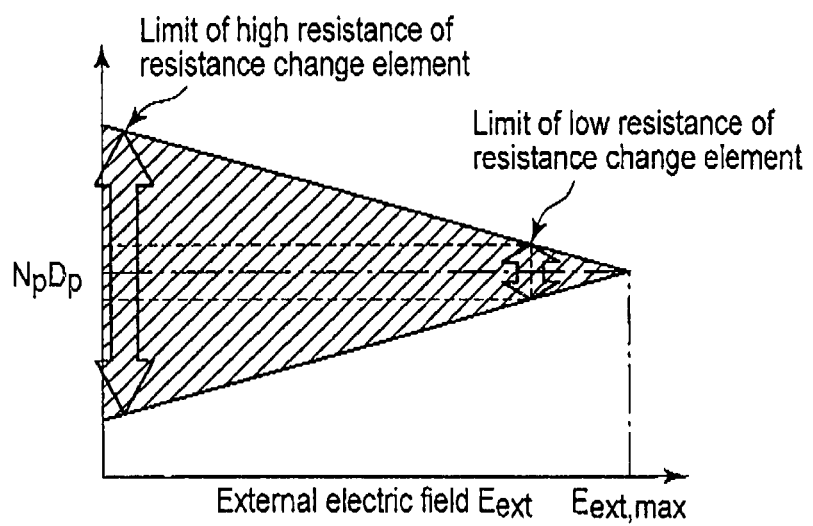
FIG. 11 is a view showing a relationship between an external electric field and the best area of an impurity area density of the p-layer at the center.

Next, in the situation that the resistance value of the resistance change element is sufficiently smaller than the impedance of the diode element, as is obvious from FIG. 11, when the external electric field $E_{ext}$ for the diode increases extremely, the best area of $N_pD_p$ that can reduce a leakage current in the half-selected state is eliminated. Considering this situation, a maximum value $E_{ext,max}$ that can realize optimization of the leakage current in the half-selected state is an electric field when the upper limit and the lower limit of $N_pD_p$ represented by Expression (7) are equal, and hence the following Expression (9) can be achieved.

$$E_{ext,max} = \frac{E_{th}}{2} - \frac{qN_nD_n}{4\varepsilon_{Si}} \qquad (9)$$

An optimum value of $N_pD_p$ associated with this maximum external electric field is represented by the following expression (10).

$$N_pD_p = \frac{\varepsilon_{Si}E_{th}}{q} + \frac{2N_nD_n}{4} \qquad (10)$$

As can be understood from FIG. 11, in the state of Expression (10), ($0 \leq E_{ext} \leq E_{ext,max}$) and $N_pD_p$ can be always maintained in the optimum state irrespective of the external electric field $E_{ext}$. That is, Expression (10) represents conditions that can assuredly reduce the leakage current in the half-selected state without being dependent on the resistance value of the resistance change element. However, as Expression (10) only represents a value of a single $N_pD_p$, it is too narrow as an optimum condition range.

How this is dealt with in an actual memory cell operation will now be considered.

In the memory cell operation, the operation is never performed with the electric field $E_{ext,max}$ in Expression (9) where the single best point alone is provided. In practice, the electric field should be alleviated unit it reaches approximately 0.8× $E_{ext,max}$, and the diode element in the memory cell should be operated with a sufficient margin. When the operation electric field is reduced in this manner, the best area of $N_pD_p$ can be widened.

In effect, assuming that the external electric field is 0.8× $E_{ext,max}$, the area of $N_pD_p$ falling within the range of ±20% from a value of Expression (10) can suffice. When the diode element is designed in such a manner that $N_pD_p$ can fall within this area, it is possible to cope with a resistance change element having a wide resistance range, and a memory cell array operation with high cell selectivity can be carried out.

(Best Area of Impurity Concentration of Dopants in n-Layer Placed at Both Ends of Diode)

For example, as shown in FIG. 4, to suppress an element height, such a "completely depleted" state in which an electric flux directly runs between each electrode and a p-type semiconductor layer is assumed for the diode of an embodiment. Therefore, an impurity concentration of dopants in the n-type semiconductor layer does not have to be high, and it can be said that a lower limit of this impurity concentration is zero.

On the other hand, an upper limit of the impurity concentration of the dopants in the n-type semiconductor layer can be derived from the following two approaches. One approach is a condition that is required for using the diode of the embodiment in a completely depleted state. In a zero bias state, a boundary between the complete depletion of the n-type semiconductor layer and the p-type semiconductor layer or the presence of a neutral region in each of the n-type semiconductor layer and the p-type semiconductor layer is determined based on the following condition. That is, the electric flux extending from dopant impurities in the p-type semiconductor layer is terminated within the two n-type semiconductor layers without any residue. That is, the following Expression (11) is achieved.

$$q(2N_nD_n) = qN_pD_p \qquad (11)$$

It is to be noted that the complete depletion is not attained when dopant concentrations in the n-type semiconductor layers are higher, and a neutral region is generated in the n-type semiconductor layers. Therefore, a condition, i.e., the following Expression (12) must be met in regard to an upper limit and a lower limit of a sum total ($2N_pD_p$) of impurity surface densities as the dopants in the two n-type semiconductor layers.

$$0 \leq 2N_nD_n \leq N_pD_p \qquad (12)$$

Further, the other approach is a situation in which the potential barrier at the cathode edge becomes zero as a result of increasing the dopant concentration in the n-type semiconductor layer on the cathode side, which determines an upper limit of the dopant concentration in the n-type semiconductor layer. However, this condition is already included in Expression (4), and it is included in the formulation of the best area of the impurity concentration of the p-type semiconductor layer.

(Relative Relationship Between Impurity Concentrations of p-Layer and n-Layer)

A relationship between an impurity concentration in the p-layer and an impurity concentration in the n-layer that enables acquisition of the best characteristics of a selector of the resistance change memory when these impurity concentrations are independently changed is summarized as follows.

As shown in (a) in FIG. 12, a diode element as a simulation target is assumed to be a punch-through diode having an npn structure having an n-type semiconductor layer (25 nm), a p-type semiconductor (25 nm), and a n-type semiconductor (25 nm). As a result of changing an impurity concentration in the p-layer and an impurity concentration in each n-layer in wide ranges to perform the simulation, the best characteristics of the selector of the resistance change memory can be obtained when a relationship in a range S is met as shown in (b) in FIG. 12. It is to be noted that a temperature is 300 K (an absolute temperature).

Figure 13:
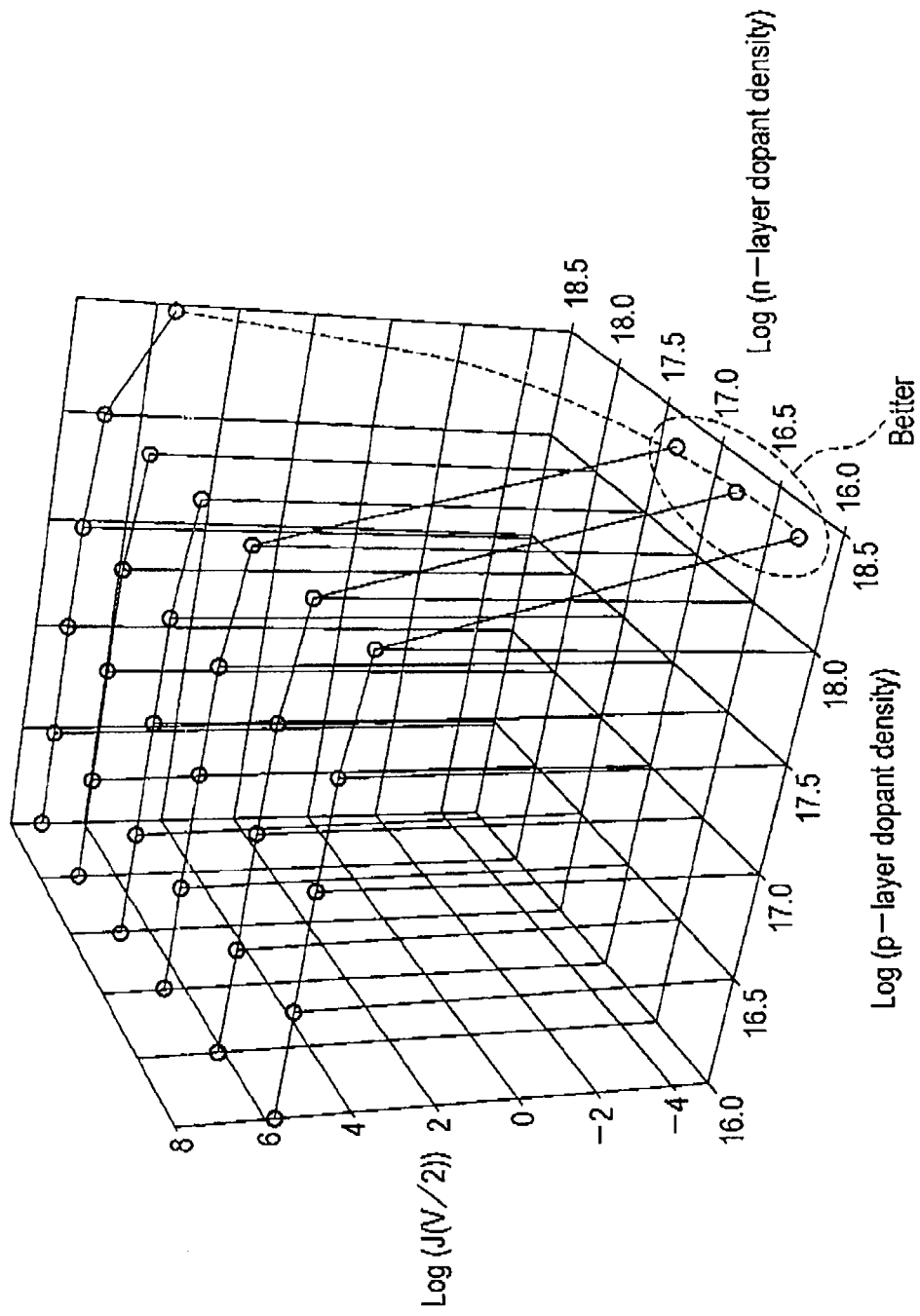
FIG. 13 is a view showing dependency of J (V/2) to the impurity concentrations in the p-layer and the p-layer.

FIG. 13 quantitatively shows dependency of J(V/2) to the impurity concentrations in the p-layer and the n-layer. Here, J(V/2) is a current (a half-selected current) when V/2 is applied to the diode element (a half-selected state). As is obvious from the drawing, when the impurity concentration $N_p$ of the p-layer is set to the $10^{18}$ cm$^{-3}$ level and the impurity concentration $N_n$ of the n-layer is set to approximately $10^{17}$ cm$^{-3}$ or below, the best characteristics can be obtained.

Figure 14:
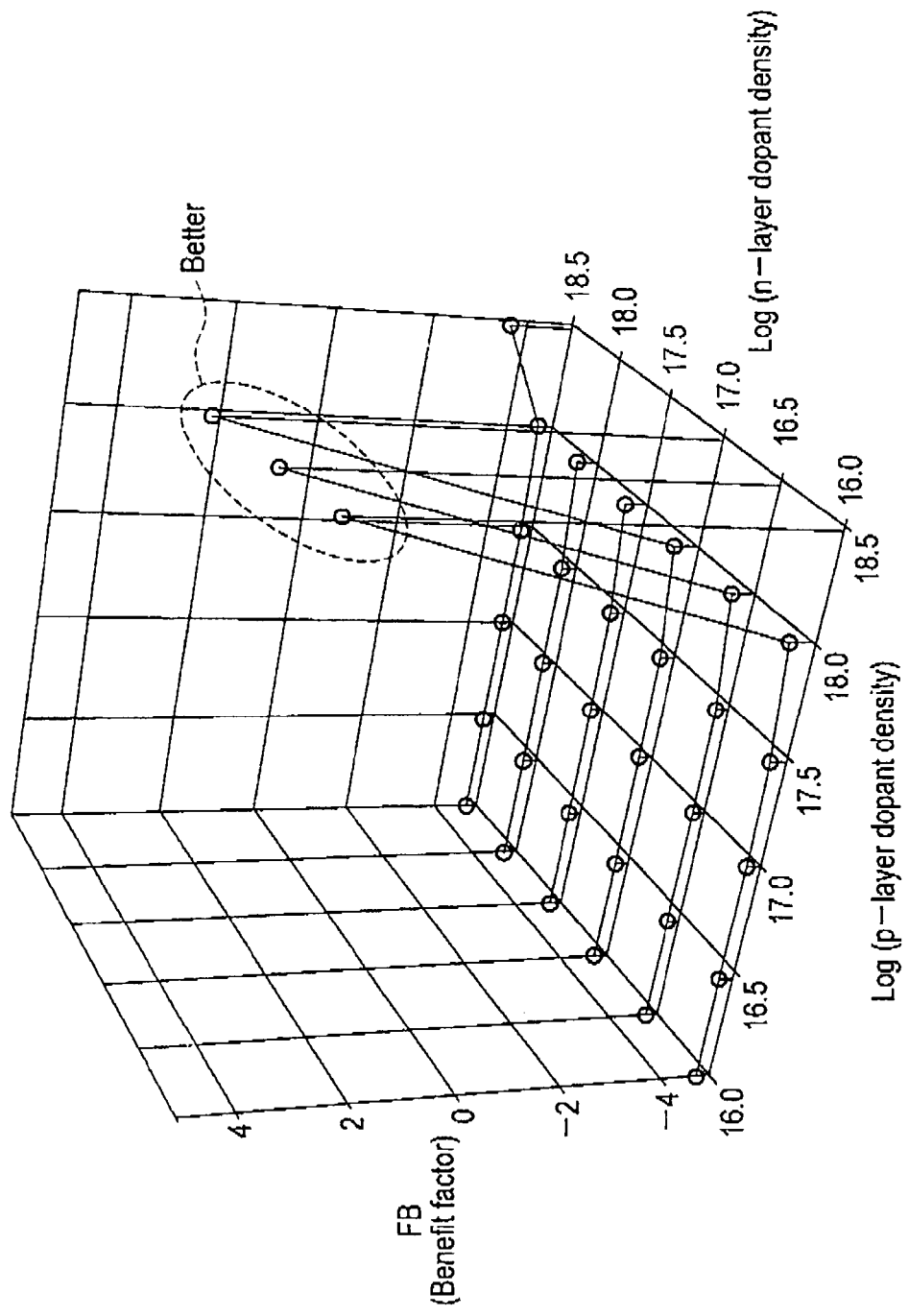
FIG. 14 is a view showing dependency of a benefit factor FB to the impurity concentrations in the p-layer and the n-layer.

FIG. 14 shows dependency of a benefit factor FB to the impurity concentrations in the p-layer and the n-layer. Here, FB is defined as $\{J(V)/10^5 \text{ (A/cm}^2)\} \times \{1(\text{A/cm}^2)/J(V/2)\}$. J(V) means a current (a selected current) when V is applied to the diode element (a selected state). As is obvious from the drawing, for example, when the impurity concentration N of the p-layer is on the $10^{18}$ cm$^{-3}$ level and the impurity concentration $N_n$ of the n-layer is approximately $1 \times 10^{17}$ cm$^{-3}$ or below, considering both the ON current (a selected current) and the OFF current (a half-selected current) enables obtaining the greatest advantage.

(Conclusion of Best Area of Impurity Concentrations in p-Layer and n-Layer)

Summarizing the above considerations, for the best area of the impurity area density as the dopants in each of the p-layer and the n-layer, adopting one of the following conditions can suffice. One of the conditions is achieving both Expression (8) and Expression (12) at the same time. The other is achieving both the range with a margin of approximately ±20% in Expression (10) and Expression (12) at the same time.

The former condition can be applied when the resistance value of the resistance change element is sufficiently larger than the impedance of the diode element. Further, the latter condition can be applied irrespective of the resistance value of the resistance change element, and the best area of the impurity area density of the dopants in each of the p-layer and the n-layer is set to be narrower than that in the former condition.

(Method for Deriving Threshold Electric Field of Interband Tunneling Current)

In the above description, the threshold electric field $E_{th}$ of the interband tunneling current is used as a parameter that is important to decide the impurity area density in the p-layer. Therefore, how to decide the threshold electric field Eth must be defined in advance.

Since electrons (or holes) are conducted through a band gap of a semiconductor by tunneling, an intensity of the interband tunneling current can be estimated by formulation of a Fowler-Nordheim (FN) tunneling current. Here, as an example, a case that a threshold electric field is estimated based on formulation of the FN tunneling current will be described.

The FN tunneling current is represented by the following Expression (13).

$$J = \alpha E^2 \exp\left(-\frac{\beta}{E}\right) \quad (13)$$

where $\alpha = A/m_{\mathit{eff}}\phi_b$, $\beta = B\sqrt{m_{\mathit{eff}}}\phi_b^{3/2}$ In this expression, known numerical values, i.e., $A=1.54 \times 10^6$ (VA/cm$^2$), $B=68.3$ (V$^{-1/2}$ cm$^{-1}$), and $m_{\mathit{eff}}=0.42$ (a value normalized by an electron mass) are used.

Figure 15:
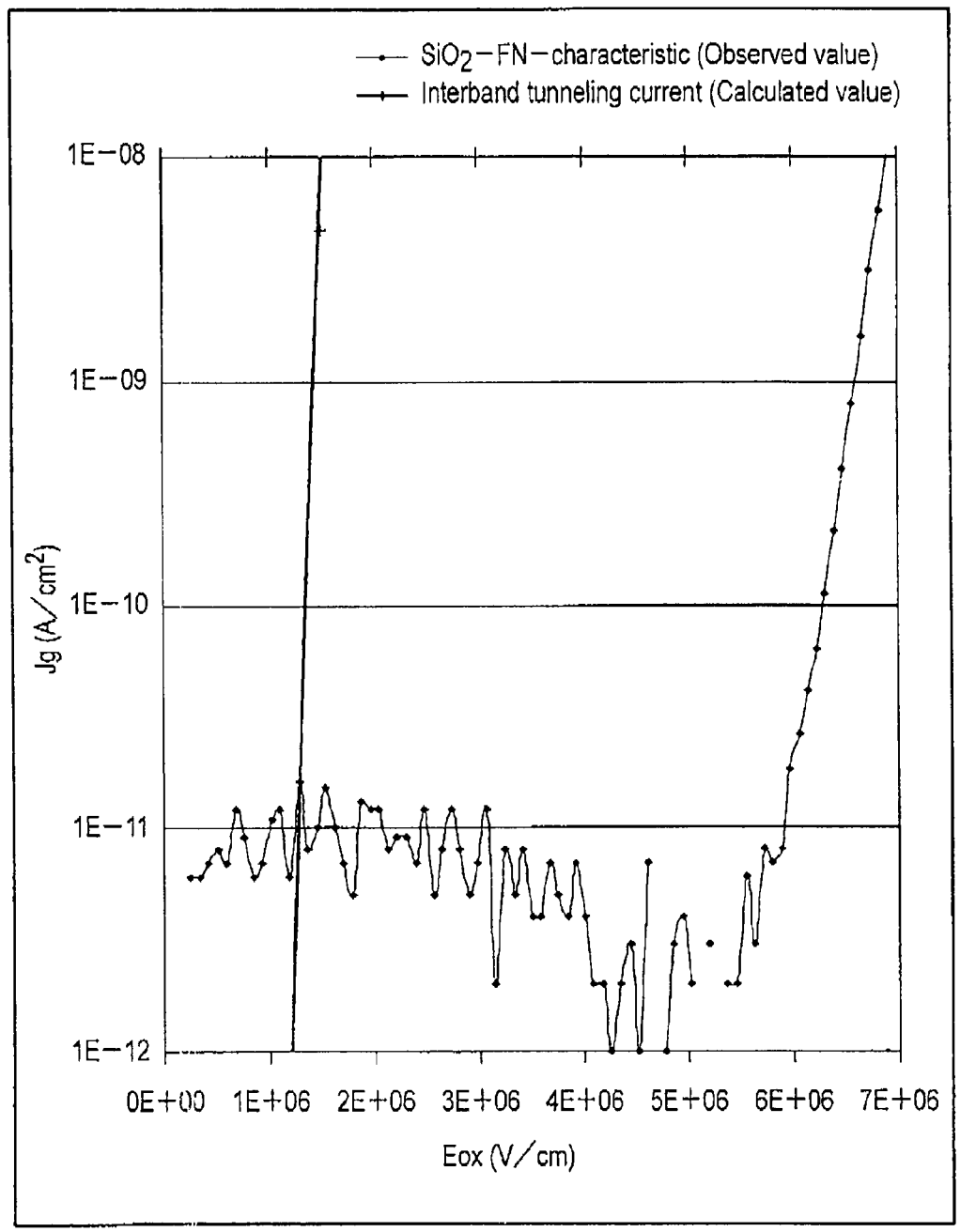
FIG. 15 is a view showing a definition and a calculation method of an interband tunneling current.

If the semiconductor layer is made of Si, a band gap of Si (1.12 eV) can be determined as a barrier height. FIG. 15 shows the thus calculated interband tunneling current. This drawing also shows an actual measurement example of the FN tunneling current flowing through an insulating layer (SiO$_2$) of an MOS capacitor for reference. As can be understood from the drawing, a limit of the leakage current that can actually be measured is approximately $10^{-11}$ (A/cm$^2$) in terms of a typical sample area for testing. Considering this limit, a current of $10^{-10}$ (A/cm$^2$), which is a current one digit larger, is selected as a reference current value used for deciding a threshold electric field of the interband tunneling current.

Under this reference, $E_{th}=1.4$ (MV/cm) is obtained as the threshold electric field of the interband tunneling current of Si from the calculation of the FN tunneling current with respect to the Si band gap. It is to be noted that, even in the case of using a semiconductor material other than Si for the diode element, the threshold electric field of the interband tunneling current can be estimated by the same method utilizing a band gap of each semiconductor material.

(Method of Verifying Implementing Status)

In an embodiment, an area density of dopant impurities included in the n-type semiconductor layer and the p-type semiconductor layer of the diode element in the resistance change memory is specified. On the other hand, in various physical analyses used for verifying an implementing status of a device of the embodiment, a volume density of the impurities as the dopants is often measured. Therefore, when a distribution of the volume density (a distribution in a depth direction or a distribution in an element height direction) of the impurities as the dopants included in the n-type semiconductor layer and the p-type semiconductor layer is measured by these methods and then integration in the depth direction is performed, the area density of the impurities as the dopants can be calculated.

One of the methods of measuring the volume density of the impurities as the dopants is SIMS (Secondary Ion Mass Spectrometry). This method has specific characteristic in that a detectable element concentration range is wide and highly sensitive evaluation can be carried out. However, on the other hand, a wide area (which is usually approximately several-μm square) is required as an analysis region, and hence directly measuring a distribution of an impurity concentration of the dopants in a fine memory cell array having a dimension of approximately several-ten nm is difficult.

On the other hand, there is a method called "scanning spreading resistance microscopy" (SSRM). According to this method, although a sample surface is scanned with a probe by an AFM (Atomic Force Microscopy) control technology, a bias voltage is applied to the probe at this moment, and a current flowing through the probe is measured to evaluate a local "spreading resistance".

Since the spreading resistance is associated with the impurity concentration of the dopants, a distribution of the impurity concentration of the dopants in a semiconductor sample can be measured. A relationship between the spreading resistance and the impurity concentration of the dopants can be corrected by, e.g., a method of fabricating a test sample having a large area and associating this sample with a SIMS measurement result in advance.

In SSRM, measurement can be performed up to the range of approximately $10^{14}$ to $10^{20}$ cm$^{-3}$ as the impurity concentration of the dopants in the semiconductor. Further, since a measurement resolution is as high as 3 nm, SSRM can be used as a method of evaluating an impurity concentration distribution of the dopants in the memory cell array of the resistance change memory.

It is to be noted that the p-type semiconductor and the n-type semiconductor cannot be discriminated from each other in SSRM, whereas the p-type semiconductor and the n-type semiconductor can be discriminated from each other based on a change in capacity in scanning capacitance microscopy (SCM). Therefore, using both SSRM and SCM enables verifying an implementing status of a device of the embodiment.

(Electrodes at Both Ends of Diode)

Since the embodiment is characterized in a configuration of the diode element, conductive materials can be extensively used for electrodes at both ends thereof. Therefore, various combinations of electrode materials at both the ends of the diode, e.g., a metal layer/a metal layer, a metal layer/a semiconductor layer, a semiconductor layer/a semiconductor layer, and others can be assumed.

It is to be noted that the metal layer used herein extensively means a conductive layer including a material having free electrons that contribute to electrical conduction. Therefore, as the metal layer, materials having conductivity, e.g., a metal nitride, a metal silicide, a metal carbide, and others can be extensively used besides simple metal elements.

Furthermore, as the semiconductor layer used for the electrode, a simple element semiconductor such as Si or Ge and a compound semiconductor such as GaN can be extensively utilized. As a matter of course, to increase the conductivity, a material obtained by adding dopant impurities to the semiconductor can be likewise used as the electrode of a device of the embodiment.

(Operation Mode of Resistance Change Element)

In the diode element of the embodiment, it is assumed that the resistance change element connected to this diode element in series performs the bipolar operation. Therefore, the diode element of the embodiment has a configuration that current-voltage characteristics in a forward direction are symmetrical to those in a reverse direction. However, it is needless to say that the application range of the diode element of this embodiment can be extended in not only a case that the resistance change element carries out the bipolar operation but also a case that the resistance change element performs the unipolar operation.

EMBODIMENTS

Device examples of the embodiments will now be specifically explained hereinafter with reference to the drawings. Moreover, in the drawings mentioned below, like reference numerals denote like parts, thereby omitting overlapping descriptions.

First Embodiment

FIG. 16 is a perspective view showing a memory cell array of a resistance change memory of a first embodiment. Reference numeral 1 in the drawing denotes an Si substrate; 2, an $SiO_2$ layer; 3, a memory cell unit; 10, a lower electrode (a first interconnect line); 80, an upper electrode (a second interconnect line); 100, a first interconnect layer; and 1000, a second interconnect layer.

First interconnect lines 10 that are aligned in parallel and extend in the same direction are arranged on Si substrate 1. First interconnect lines 10 form first interconnect layer 100. Second interconnect lines 80 are arranged to be apart from first interconnect layer 100 and to cross first interconnect lines 10 in first interconnect layer 100. Second interconnect lines 80 form second interconnect layer 1000. First interconnect layer 100 functions as, e.g., word lines, and second interconnect layer 1000 functions as, e.g., bit lines.

Memory cell unit 3 is provided at each intersecting portion of first interconnect lines 10 and second interconnect lines 80. Memory cell unit 3 has a stacked structure including a resistance change element that stores states having different resistance values as data and a diode element having non-ohmic properties. As described above, the memory cell array has a crosspoint structure that memory cell unit 3 is sandwiched between lower electrodes (first interconnect lines) 10 and upper electrodes (second interconnect lines) 80.

FIG. 17 is a cross-sectional view showing a configuration of a memory cell unit of the first embodiment.

On each lower electrode 10 as a word line are stacked n-type Si layer 120 which has a thickness of 25 nm and an impurity concentration $1 \times 10^{17}$ cm$^{-3}$ of dopants, p-type Si layer 130 which has a thickness of 25 nm and an impurity concentration $3 \times 10^{18}$ cm$^{-3}$ of dopants, and n-type Si layer 140 which has a thickness of 25 nm and an impurity concentration $1 \times 10^{17}$ cm$^{-3}$ of dopants, and these layers constitute diode element 150 having an npn structure. Intermediate electrode 60 is provided on diode element 150, and resistance change element (variable resistive film) 70 is provided thereon. The resistance of resistance change element 70 can be changed by using a voltage, a current, heat, or chemical energy, and states having different resistance values can be stored as data. Upper electrode 80 is arranged on resistance change element 70.

In the case of this configuration, the impurity concentration of dopants in the p-type semiconductor layer is $N_p=3 \times 10^{18}$ cm$^{-3}$, the film thickness of the p-type semiconductor layer is $D_p=25$ nm, the impurity concentration of dopants in the n-type semiconductor layer is $N_n=1 \times 10^{17}$ cm$^{-3}$, and the film thickness of the n-type semiconductor layer is $D_n=25$ nm.

Therefore, $N_n D_n=2.5 \times 10^{11}$ cm$^{-2}$, $N_p D_p=7.5 \times 10^{12}$ cm$^{-2}$, and Eth=1.4 (MV/cm) are achieved, and $2 \epsilon_{Si} E_{th}/q=1.8 \times 10^{13}$ cm$^{-2}$ can be provided. This meets Expression (8) and Expression (12).

Additionally, since an area density corresponding to 80% in Expression (10) is $7.3 \times 10^{12}$ cm$^{-2}$ and an area density corresponding to 120% of Expression (10) is $1.1 \times 10^{13}$ cm$^{-2}$, $N_p D_p$ is also included in the range of ±20% of Expression (10).

The electrodes arranged above and below diode element 150 will now be described.

In this embodiment, n$^+$-type Si (a work function: approximately 4 eV) is used as lower electrode 10 that is in contact with n-type Si layer 120 which is the lowermost layer in diode element 150. When an electrode having a work function close to that of the lowermost layer in diode element 150 is used, a potential barrier between lower electrode 10 and n-type Si layer 120 can be reduced, and an ON current in the diode element can be increased.

On the other hand, TaSiN is used as intermediate electrode 60 that is in contact with n-type Si layer 140 which is the uppermost layer in diode element 150. Here, TaSiN is a material that is also utilized for a gate electrode of an n-channel MOSFET and has a work function close to that of n-type Si layer 140. Therefore, a potential barrier between intermediate electrode 60 and n-type Si layer 140 can be reduced, and the ON current in diode element 150 can be increased.

It is to be noted that, as the material of intermediate electrode 60, any other material may be selected besides TaSiN. In this case, attention must be paid to set a work function of the electrode material close to that of the n-type Si layer. As examples of such a material, there are Si(n$^+$poly-Si), Hf, Zr, Al, Ti, Ta, TaSi$_x$, TaC, TaN, TiN, HfSi$_x$, HfSiN, and others. Here, x is an arbitrary number other than 0 and means that a wide composition range is possible.

It is to be noted that the electrodes at the upper end and the lower end of diode element 150 are made of different materials in this embodiment, but the electrodes at the upper end and the lower end of diode element 150 are often made of the same material on the grounds of a process and a cost.

Primary parts of a method of fabricating the diode element of this embodiment will now be described.

Lower n-type Si layer 120 is deposited by a low pressure chemical vapor deposition (LPCVD) method using monosilane as a raw material gas in the temperature range of 520° C. to 620° C. At this time, phosphorous as an n-type dopant may be subjected to in-situ doping by adding phosphine in the raw material gas in a deposition process, or it may be formed by carrying out ion implantation of phosphorous after the deposition of the Si layer.

Then, p-type Si layer 130 is deposited by the LPCVD method using monosilane as a raw material gas in the temperature range of 520° C. to 620° C. At this time, boron as a p-type dopant may be subjected to in-situ doping by adding diborane in the deposition process, or an ion implantation of boron may be performed after deposition of the Si layer.

Finally, n-type Si layer 140 which is the uppermost layer is formed by the same method as the method of forming the n-type Si layer 120 which is the lowermost layer. It is to be noted that an ALD (atomic layer deposition) method may be used in place of the deposition of Si based on the LPCVD method. Further, any other deposition method such as a sputtering method can be appropriately used.

As described above, according to the present embodiment, the diode element in the resistance change memory has the npn structure obtained by sequentially stacking n-type Si layer 120, p-type Si layer 130, and n-type Si layer 140. At this time, when a relationship between an area density of dopant impurities in n-type Si layer 120 or 140 and an area density of dopant impurities in p-type Si layer 130 is adjusted to meet Expression (8) and Expression (12), a large ratio of the ON current and the OFF current in diode element 150 can be achieved.

Therefore, the diode element that is superior in selectivity for the resistance change element and has a suppressed element height can be realized in the memory cell array having the crosspoint structure. Further, as a result, miniaturization and improvement in characteristics of the memory cell array in the resistance change memory can be achieved.

Second Embodiment

FIG. 18 is a cross-sectional view showing a configuration of a memory cell unit of a second embodiment.

A memory cell array having this memory cell unit as a constituent element is as shown in FIG. 16 like the first embodiment.

This embodiment is characterized in that a height of a diode element is suppressed and an impurity concentration of dopants in a p-type Si layer at the center is increased as compared with the first embodiment.

On lower electrode 10 as a word line are stacked n-type Si layer 200 which has a thickness of 20 nm and an impurity concentration $1 \times 10^{17}$ cm$^{-3}$ of dopants, p-type Si layer 210 which has a thickness of 10 nm and an impurity concentration $8.6 \times 10^{18}$ cm$^{-3}$ of dopants, and n-type Si layer 220 which has a thickness of 20 nm and an impurity concentration $1 \times 10^{17}$ cm$^{-3}$ of dopants, and these layers form diode element 230 having an npn structure. Intermediate electrode 60 is provided on diode element 230, and resistance change element (a resistance change film) 70 is provided thereon. Furthermore, upper electrode 80 is arranged on resistance change element 70.

In the case of this configuration, the impurity concentration of dopants in the p-type semiconductor layer is $N_p=8.6 \times 10^{18}$ cm$^{-3}$, the film thickness of the p-type semiconductor layer is $D_p=10$ nm, the impurity concentration of dopants in the n-type semiconductor layer is $N_n=1 \times 10^{17}$ cm$^{-3}$, and the film thickness of the n-type semiconductor layer is $D_n=20$ nm.

Therefore, $N_n D_n = 2 \times 10^{11}$ cm$^{-2}$, $N_p D_p = 8.6 \times 10^{12}$ cm$^{-2}$, and $E_{th}=1.4$ (MV/cm) are achieved, and $2 \in_{Si} E_{th}/q = 1.8 \times 10^{13}$ cm$^{-2}$ can be provided. This meets Expression (8) and Expression (12).

Additionally, since an area density corresponding to 80% of Expression (10) is $7.3 \times 10^{12}$ cm$^{-2}$ and an area density corresponding to 120% of Expression (10) is $1.1 \times 10^{13}$ cm$^{-2}$, $N_p D_p$ is also included in the range of ±20% of Expression (10).

This embodiment is characterized in that a height of the memory cell array having the crosspoint structure can be suppressed as compared with the first embodiment. Therefore, when this embodiment is carried out while reducing a line width of the memory cell array in the resistance change memory, a bit density can be improved based on further miniaturization of the memory cell array.

Third Embodiment

FIG. 19 is a cross-sectional view showing a configuration of a memory cell unit of a third embodiment.

A memory cell array is as shown in FIG. 16 like the first embodiment.

This embodiment is characterized in that an ultrathin insulating film configured to prevent diffusion of dopant impurities is sandwiched between an n-layer and a p-layer of an npn-type diode element in the second embodiment. According to this configuration, a steep distribution of the dopant impurities can be formed, thereby further contributing to a reduction in height of the memory cell array having the crosspoint structure.

On lower electrode 10 as a word line are stacked n-type Si layer 30 which has a thickness of 20 nm and an impurity concentration $1 \times 10^{16}$ cm$^{-3}$ of dopants, silicon nitride film 310 having a thickness of 1 nm, p-type Si layer 320 which has a thickness of 10 nm and an impurity concentration $8.6 \times 10^{18}$ cm$^{-3}$ of dopants, silicon nitride film 330 having a thickness of 1 nm, and n-type Si layer 340 which has a thickness of 20 nm and an impurity concentration $1 \times 10^{16}$ cm$^{-3}$ of dopants, and these layers form diode element 350 having an npn structure. Intermediate electrode 60 is provided on diode element 350, and resistance change element (a resistance change film) 70 is provided thereon. Upper electrode 80 is arranged on resistance change element 70.

In the case of this configuration, the impurity concentration of dopants in the p-type semiconductor layer is $N_p=8.6 \times 10^{18}$ cm$^{-3}$, the film thickness of the p-type semiconductor layer is $D_p=10$ nm, the impurity concentration of dopants in the n-type semiconductor layer is $N_n=1 \times 10^{16}$ cm$^{-3}$, and the film thickness of the n-type semiconductor layer is $D_n=20$ nm.

Therefore, $N_n D_n = 2 \times 10^{10}$ cm$^{-2}$, $N_p D_p = 8.6 \times 10^{12}$ cm$^{-2}$, and $E_{th}=1.4$ (MV/cm) are achieved, and $2 \in_{Si} E_{th}/q = 1.8 \times 10^{13}$ cm$^{-2}$ can be provided. This meets Expression (8) and Expression (12).

Additionally, since an area density corresponding to 80% of Expression (10) is $7.2 \times 10^{12}$ cm$^{-2}$ and an area density corresponding to 120% of Expression (10) is $1.1 \times 10^{13}$ cm$^{-2}$, $N_p D_p$ is also included in the range of ±20% of Expression (10).

A method of fabricating the diode element of this embodiment will now be supplemented.

The ultrathin silicon nitride film can be likewise formed by performing plasma nitridation on a surface of the already deposited Si layer besides a forming method using LPCVD or ALD. A film thickness of the thus formed silicon nitride film must be designed to prevent the ON current in the diode element from being deteriorated, and a film thickness of approximately 1 nm or below is desirable. Furthermore, this silicon nitride film does not necessarily have to have a stoichiometric composition, and it may be a nitride film having, e.g., an Si-rich composition.

Fourth Embodiment

FIG. 20 is a cross-sectional view showing a configuration of a memory cell unit of a fourth embodiment.

A memory cell array is as shown in FIG. 16 like the first embodiment.

This embodiment is characterized in that fluorine is introduced in a p-layer at the center of an npn-type diode element in the second embodiment. The introduction of fluorine functions to suppress diffusion of dopant impurities (boron) in a p-type Si layer. Therefore, a steep distribution of the impurities as the dopants can be formed, thereby further contributing to a reduction in height of the memory cell array having the crosspoint structure.

On lower electrode 10 as a word line are stacked n-type Si layer 400 which has a thickness of 20 nm and a concentration $1\times10^{16}$ cm$^{-3}$ of dopant impurities (phosphorous), p-type Si layer 410 which has a thickness of 10 nm and a concentration $8.6\times10^{18}$ cm$^{-3}$ of dopant impurities (boron) and contains fluorine (an area density: $5\times10^{14}$ cm$^{-2}$), and n-type Si layer 420 which has a thickness of 20 nm and a concentration $1\times10^{16}$ cm$^{-3}$ of dopant impurities (phosphorous), and these layers form diode element 450 having an npn structure. Intermediate electrode 60 is provided on diode element 450, and resistance change element (a resistance change film) 70 is provided thereon. Upper electrode 80 is arranged on resistance change element 70.

In regard to a method of fabricating the diode element having this configuration, fluorine can be introduced by ion implantation having an appropriate depth (Rp: Projected Range) after forming the npn structure, for example. It is desirable for the introduced fluorine to be present mainly in the p-type Si layer in light of suppressing diffusion of boron, but the fluorine may be diffused to the region of the n-type Si layer.

It is to be noted that, when an amount of introduced fluorine is too large, the fluorine may be diffused to positions other than the memory cell to possibly cause deterioration in characteristics of the resistance change memory, and hence setting an area density of the introduced fluorine to fall within the range of approximately $1\times10^{13}$ cm$^{-2}$ to $1\times10^{15}$ cm$^{-2}$ is desirable. A volume density of the fluorine is a value obtained by dividing the area density by the thickness of the p-type Si layer or the thickness of the npn structure.

Furthermore, to prevent the fluorine from being diffused to positions other than in the memory cell array, a measure, e.g., firstly attaching a silicon nitride film to a side surface of the memory cell unit and secondly depositing an ultrathin silicon nitride film between the diode element and electrodes provided at both ends of the diode element is taken. As a result, fluorine can be prevented from being diffused to positions other than in the diode element (the npn structure).

Fifth Embodiment

FIG. 21 is a cross-sectional view showing a configuration of a memory cell unit of a fifth embodiment.

The memory cell array is as shown in FIG. 16 like the first embodiment.

This embodiment is characterized in that carbon is introduced into two n-layers of a diode element. The introduction of carbon can obtain an effect of making it difficult for impurities (boron) as dopants introduced in a p-type Si layer to diffuse to an n-type Si layer, thus forming a steep distribution of the impurities as the dopants. Moreover, since carbon introduced in the n-layer also has an effect of enlarging a band gap, an interband tunneling current can be suppressed. Therefore, an effect of reducing a height of the memory cell array having the crosspoint structure and decreasing a leakage current in a half-selected state can be obtained.

On lower electrode 10 as a word line are stacked n-type Si layer 500 which has a thickness of 20 nm and an impurity concentration $1\times10^{16}$ cm$^{-3}$ of dopants and contains carbon having an area density of $5\times10^{14}$ cm$^{-2}$, p-type Si layer 510 which has a thickness of 10 nm and a concentration $8.6\times10^{18}$ cm$^{-3}$ of dopant impurities (Boron), and n-type Si layer 520 which has a thickness of 20 nm and an impurity concentration $1\times10^{16}$ cm$^{-3}$ of dopants and contains carbon having an area density of $5\times10^{14}$ cm$^{-2}$, and these layers form diode element 550 having an npn structure. Intermediate electrode 60 is provided on diode element 550, and resistance change element (a resistance change film) 70 is provided thereon. Upper electrode 80 is arranged on resistance change element 70.

In regard to a method of fabricating the diode element having the configuration, the introduction of carbon into the n-type Si layer can be carried out by, e.g., ion implantation. A concentration of carbon to be introduced should be set to fall within the range of 0.1 (Atomic %) to 2 (Atomic %). Among others, to sufficiently suppress diffusion of boron, setting this concentration of carbon to 0.2 (Atomic %) or above, i.e., $1\times10^{20}$ cm$^{-3}$ or above in terms of a volume density is desirable. Additionally, to suppress a crystal defect in Si caused by the introduction of carbon, setting this concentration to 1.5 (Atomic %) or below is desirable.

It is to be noted that introducing carbon to each of the two n-type semiconductor layers in the diode element is desirable, but the effect of this embodiment can be partially obtained when this introduction is performed with respect to one of the n-type semiconductor layers.

Sixth Embodiment

FIG. 22 is a cross-sectional view showing a configuration of a memory cell unit of a sixth embodiment.

The memory cell array is as shown in FIG. 16 like the first embodiment.

This embodiment is characterized in that a pnp-type diode element is used in place of the npn-type diode element. In general, there are many electrode materials whose work functions are close to a valence band rather than a conduction band of silicon. Therefore, if a semiconductor layer directly bonded to an electrode is made of p-type Si, an advantage that a Schottky type potential barrier is hardly formed and a large ON current in the diode element can be acquired can be obtained.

On lower electrode 10 as a word line are stacked a p-type Si layer 600 which has a thickness of 20 nm and an impurity concentration $1\times10^{17}$ cm$^{-3}$ of dopants, n-type Si layer 610 which has a thickness of 10 nm and an impurity concentration $8.6\times10^{18}$ cm$^{-3}$ of dopants, and p-type Si layer 620 which has a thickness of 20 nm and an impurity concentration $1\times10^{17}$ cm$^{-3}$ of dopants, and these layers form diode element 650 having a pnp structure. Intermediate electrode 630 is provided on diode element 650, and resistance change element (a resistance change film) 70 is provided thereon. Upper electrode 80 is arranged on resistance change element 70.

The description on electrode materials consistent with this diode element 650 will now be supplemented.

In this embodiment, p$^+$-type Si (a work function: approximately 5 eV) is used as lower electrode 10 that is in contact with p-type Si layer 600 which is the lowermost layer in diode element 650. Using an electrode whose work function is close to that of the lowermost layer in the diode element 650 enables reducing a potential barrier between lower electrode 10 and p-type semiconductor layer 600 and increasing an ON current.

On the other hand, Ru is used for intermediate electrode 630 that is in contact with p-type Si layer 620 which is the uppermost layer in diode element 650. Ru is a material which is also used for a gate electrode of a p-channel MOSFET and has a work function close to that of p-type Si layer 620. Therefore, a potential barrier between intermediate electrode 630 and p-type semiconductor layer 620 can be reduced, and an ON current can be increased.

It is to be noted that, as the material of intermediate electrode 630, any other material having a work function close to that of a p-type semiconductor may be adopted besides Ru. As material examples, there are Pt, W, IrO$_2$, RuO$_2$, Re, TaC, TaN, Mo, MoN$_x$, MoSi$_x$, TiN, TiC, TiSiN, TiCN, Ni, Ni$_x$Si, PtSi$_x$, WC, WN, WSi$_x$, and others. Here, x is an arbitrary number other than 0 and means that a wide composition range can be used.

It is to be noted that although the electrodes at the upper end and the lower end of the diode element are made of different materials in this embodiment, both the electrodes are often made of the same material for the convenience of a process and a cost.

Seventh Embodiment

FIG. 23 is a cross-sectional view showing a configuration of a memory cell unit of a seventh embodiment.

A memory cell array is as shown in FIG. 16 like the first embodiment.

This embodiment is characterized in that impurity concentrations of dopants in two n-type Si layers are different in an npn-type diode element. As can be presumed from the electric field distribution depicted in FIG. 8, in the n-type Si layer placed on an anode side (an opposite side of an electron injection side), since a reduction rate of an electric field increases as the dopant impurity concentration rises, a regional width of a maximum electric field can be decreased. As a result, an interband tunneling current can be suppressed.

The diode structure of this embodiment is effective when one electrode is highly frequently used as an anode. That is, this structure is useful when a frequency of a write operation/read operation with respect to a resistance change element is high but a frequency of an erase operation is low, for example.

On lower electrode 10 as a word line are stacked n-type Si layer 700 which has a thickness of 20 nm and an impurity concentration $3 \times 10^{17}$ cm$^{-3}$ of dopants, p-type Si layer 710 which has a thickness of 10 nm and an impurity concentration $8.6 \times 10^{18}$ cm$^{-3}$ of dopants, and n-type Si layer 720 which has a thickness of 20 nm and an impurity concentration $1 \times 10^{17}$ cm$^{-3}$ of dopants, and these layers form diode element 750 having an npn structure. Intermediate electrode 60 is provided on diode element 650, and resistance change element (a resistance change film) 70 is provided thereon. Upper electrode 80 is arranged on resistance change element 70.

(Other Points to Consider)

The present embodiment is not restricted to the foregoing embodiments. For example, although the examples using Si as the semiconductor material have been described in the embodiments, the semiconductor material is not necessarily restricted to Si. Besides Si, semiconductor materials, e.g., a semiconductor such as Ge or GaN, silicon germanium, or silicon carbide may be used.

Further, other elements may be added to the semiconductor material to modulate the band gap thereof. Among others, in regard to the fifth embodiment, Ge may be added to the p-type silicon layer at the center in place of adding carbon to each n-type silicon layer. It is to be noted that the addition of Ge is not necessarily restricted to the p-type silicon layer alone, and Ge may be added to both the p-type silicon layer and the n-type silicon layer.

Furthermore, although the examples that phosphorous is used as impurities which are dopants in the n-type semiconductor and boron is used as impurities which are dopants in the p-type semiconductor have been described, phosphorous or boron does not necessarily have to be used as dopant impurities. For example, when the semiconductor material is Si, materials such as arsenic or antimony may be used as n-type dopants, and indium and others may be used as p-type dopants. Moreover, in the case of semiconductor materials other than Si, dopant elements known in the respective semiconductor materials can be used.

Additionally, in the embodiments, it is satisfactory for area densities of the dopant impurities in the n-type semiconductor layer and the p-type semiconductor layer to meet the relationship "Expression (8) and Expression (12)" or "the range of ±20% from Expression (10) and Expression (12)", and a shape of the distribution of the dopant impurities in each layer is not specified. That is, the distribution of the dopant impurities in each layer does not necessarily have to be uniform, and it may be, e.g., a Gaussian distribution, a complementary error function distribution, or any other arbitrary distribution. This is obvious from the description on the principle of the present embodiment.

Further, meeting the relationship "Expression (8) and Expression (12)" means that an area density $N_pD_p$ of dopant impurities in a semiconductor layer having a second conductivity type (e.g., the p type) is larger than a sum total $2N_nD_n$ of area densities of dopant impurities in two semiconductor layers having a first conductivity type (e.g., the n type) (Expression (12)) and smaller than double an area density ($\in_{Si} \times E_{th}$)/q of an electric flux number associated with a threshold electric field of an interband tunneling current of a material constituting the semiconductor layer having the second conductivity type (Expression (8)).

Furthermore, meeting the relationship "the range of ±20% from Expression (10) and Expression (12)" means that:

the area density $N_pD_p$ of dopant impurities in the semiconductor layer having the second conductivity type (e.g., the p type) is larger than the sum total $2N_nD_n$ of the area densities of dopant impurities in the two semiconductor layers having the first conductivity type (e.g., the n type) (Expression (12)); and the area density $N_pD_p$ falls within the range of ±20% of a sum (Expression (10)) of the area density ($\in_{Si} \times E_{th}$)/q of the electric flux number associated with the threshold electric field of the interband tunneling current of the material constituting the semiconductor layer having the second conductivity type and ¼ of the total area densities ($2N_nD_n$) of the dopant impurities in the two semiconductor layers having the first conductivity type.

Furthermore, as shown FIG. 16, the memory cell array with the crosspoint structure has a single layer in the embodiments. But, the memory cell array may have a three-dimensional structure in which memory cells are stacked above the semiconductor substrate. Moreover, the embodiments relate to the element technology for the diode in the memory cell, and the embodiments do not relate to a method of connecting the memory cells. Therefore, the embodiments can be applied to not only the memory cell array having the crosspoint structure but also memory cell arrays having other structures.

Additionally, the diode structure is not necessarily restricted to the application to the bipolar type resistance change element. For example, the diode of the embodiments can be likewise used in a unipolar type resistance change element. That is, the foregoing embodiments relate to the configuration of the diode element and do not restrict a system of the resistance change element.

CONCLUSION

According to the embodiments, the diode element in the resistance change memory that is thin and superior in a reduction of the OFF current can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change memory comprising:
a first interconnect layer which has first interconnect lines arranged in parallel to each other on a semiconductor substrate;
a second interconnect layer which is provided to be apart from the first interconnect layer and has second interconnect lines arranged in parallel to each other to cross the first interconnect lines; and
memory cell units arranged at respective intersecting portions of the first interconnect lines and the second interconnect lines,
wherein each of the memory cell units is configured to stack a resistance change element which stores states having different resistance values as data and a diode element having non-ohmic properties, and the diode element is configured to stack in order to a first semiconductor layer having a first conductivity type, a second semiconductor layer having a second conductivity type, and a third semiconductor layer having the first conductivity type from a side of the first interconnect layer, and
an area density of dopant impurities in the second semiconductor layer is larger than a sum total of area densities of dopant impurities in the first and third semiconductor layers, and smaller than double an area density of an electric flux number associated with a threshold electric field of an interband tunneling current of a material comprising the second semiconductor layer.

2. The memory of claim 1,
wherein each of the first, second and third semiconductor layers comprises silicon.

3. The memory of claim 2, further comprising:
a silicon nitride between the first and second semiconductor layers and between the second and third semiconductor layers.

4. The memory of claim 2,
wherein the second semiconductor layer comprises fluorine.

5. The memory of claim 2,
wherein at least one of the first and third semiconductor layers comprises carbon.

6. The memory of claim 1,
wherein the area densities of the dopant impurities in the first and third semiconductor layers are different from each other.

7. The memory of claim 6,
wherein one of the first and third semiconductor layers has a higher area density than the other, and is connected to one of the first and second interconnect lines as a word line in a memory cell array.

8. The memory of claim 1,
wherein the first conductivity type is an n type, the second conductivity type is a p type, and the diode element is a punch-through diode having an npn structure that the first, second and third semiconductor layers are depleted in a zero bias.

9. The memory of claim 1,
wherein the first conductivity type is a p type, the second conductivity type is an n type, and the diode element is a punch-through diode having a pnp structure that the first, second and third semiconductor layers are depleted in a zero bias.

10. The memory of claim 1,
wherein the first and third semiconductor layers comprise one of phosphorous, arsenic, and antimony, and the second semiconductor layer comprises one of boron and indium when the diode element has an npn structure, and the second semiconductor layer comprises one of phosphorous, arsenic, and antimony, and the first and third semiconductor layers comprise one of boron and indium when the diode element has a pnp structure.

11. A resistance change memory comprising:
a first interconnect layer which has first interconnect lines arranged in parallel to each other on a semiconductor substrate;
a second interconnect layer which is provided to be apart from the first interconnect layer and has second interconnect lines arranged in parallel to each other to cross the first interconnect lines; and
memory cell units arranged at respective intersecting portions of the first interconnect lines and the second interconnect lines,
wherein each of the memory cell units is configured to stack a resistance change element which stores states having different resistance values as data and a diode element having non-ohmic properties, and the diode element is configured to stack in order to a first semiconductor layer having a first conductivity type, a second semiconductor layer having a second conductivity type, and a third semiconductor layer having the first conductivity type from a side of the first interconnect layer, and
an area density of dopant impurities in the second semiconductor layer is larger than a sum total of area densities of dopant impurities in the first and third semiconductor layers, and set within the range of ±20% of a sum of an area density of an electric flux number associated with a threshold electric field of an interband tunneling current of a material constituting the second semiconductor layer and ¼ of the total area densities of the dopant impurities in the first and third semiconductor layers.

12. The memory of claim 11,
wherein each of the first, second and third semiconductor layers comprises silicon.

13. The memory of claim 12, further comprising:
a silicon nitride between the first and second semiconductor layers and between the second and third semiconductor layers.

14. The memory of claim 12,
wherein the second semiconductor layer comprises fluorine.

15. The memory of claim 12,
wherein at least one of the first and third semiconductor layers comprises carbon.

16. The memory of claim 11,
wherein the area densities of the dopant impurities in the first and third semiconductor layers are different from each other.

17. The memory of claim 16,
wherein one of the first and third semiconductor layers has a higher area density than the other, and is connected to a word line in a memory cell array.

18. The memory of claim 11,
wherein the first conductivity type is an n type, the second conductivity type is a p type, and the diode element is a punch-through diode having an npn structure that the first, second and third semiconductor layers are depleted in a zero bias.

19. The memory of claim 11,
wherein the first conductivity type is a p type, the second conductivity type is an n type, and the diode element is a punch-through diode having a pnp structure that the first, second and third semiconductor layers are depleted in a zero bias.

20. The memory of claim 11,
wherein the first and third semiconductor layers comprise one of phosphorous, arsenic, and antimony, and the second semiconductor layer comprises one of boron and indium when the diode element has an npn structure, and the second semiconductor layer comprises one of phosphorous, arsenic, and antimony, and the first and third semiconductor layers comprise one of boron and indium when the diode element has a pnp structure.

* * * * *